(12) United States Patent
Sthalekar et al.

(10) Patent No.: US 12,652,003 B2
(45) Date of Patent: Jun. 9, 2026

(54) RECONFIGURABLE POWER AMPLIFIER

(71) Applicant: QUALCOMM Incorporated, San Diego, CA (US)

(72) Inventors: Chirag Sthalekar, Reading, MA (US); Leon Metreaud, Pepperell, MA (US); Sanjay Nandipaku, N. Andover, MA (US); Hakan Inanoglu, Acton, MA (US); Paolo Enrico De Falco, San Diego, CA (US); Antonino Scuderi, San Diego, CA (US); Ryan Scott Castro Spring, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 434 days.

(21) Appl. No.: 18/338,282

(22) Filed: Jun. 20, 2023

(65) Prior Publication Data

US 2024/0429869 A1 Dec. 26, 2024

(51) Int. Cl.
*H03F 1/02* (2006.01)
*H03F 3/24* (2006.01)

(52) U.S. Cl.
CPC ......... *H03F 1/0277* (2013.01); *H03F 1/0288* (2013.01); *H03F 3/245* (2013.01); *H03F 2200/451* (2013.01)

(58) Field of Classification Search
CPC ....................................................... H03F 1/02
USPC ............................................. 330/124 R, 295
See application file for complete search history.

(56) References Cited

U.S. PATENT DOCUMENTS

| | | | |
|---|---|---|---|
| 8,634,782 B2 * | 1/2014 | Asuri ................... | H04B 1/0483 |
| | | | 455/552.1 |
| 8,710,927 B2 * | 4/2014 | Kamitani ............... | H03F 3/245 |
| | | | 330/51 |
| 8,970,304 B2 * | 3/2015 | Rajaee ................... | H03F 1/223 |
| | | | 330/261 |
| 9,031,158 B2 | 5/2015 | Gudem et al. | |
| 2006/0246855 A1 | 11/2006 | Kato et al. | |

FOREIGN PATENT DOCUMENTS

| | | |
|---|---|---|
| WO | WO-2013056261 A1 | 4/2013 |
| WO | WO-2014058925 A1 | 4/2014 |

OTHER PUBLICATIONS

International Search Report and Written Opinion—PCT/US2024/029293—ISA/EPO—Aug. 27, 2024.

* cited by examiner

*Primary Examiner* — Henry Choe

(74) *Attorney, Agent, or Firm* — Norton Rose Fulbright US LLP

(57) ABSTRACT

This disclosure provides systems, methods, and devices for wireless communications that support multiple antenna operation. In a first aspect, an apparatus for wireless communications includes an amplifier module comprising a first input node, a second input node, a first output node, a second output node, and a third output node, with the amplifier comprising a first processing path configured to couple the first input node to the first output node; and a second processing path configured to couple the second input node to the second output node in a first mode and to couple the second input node to the third output node in a second mode. Other aspects and features are also claimed and described.

27 Claims, 9 Drawing Sheets

400

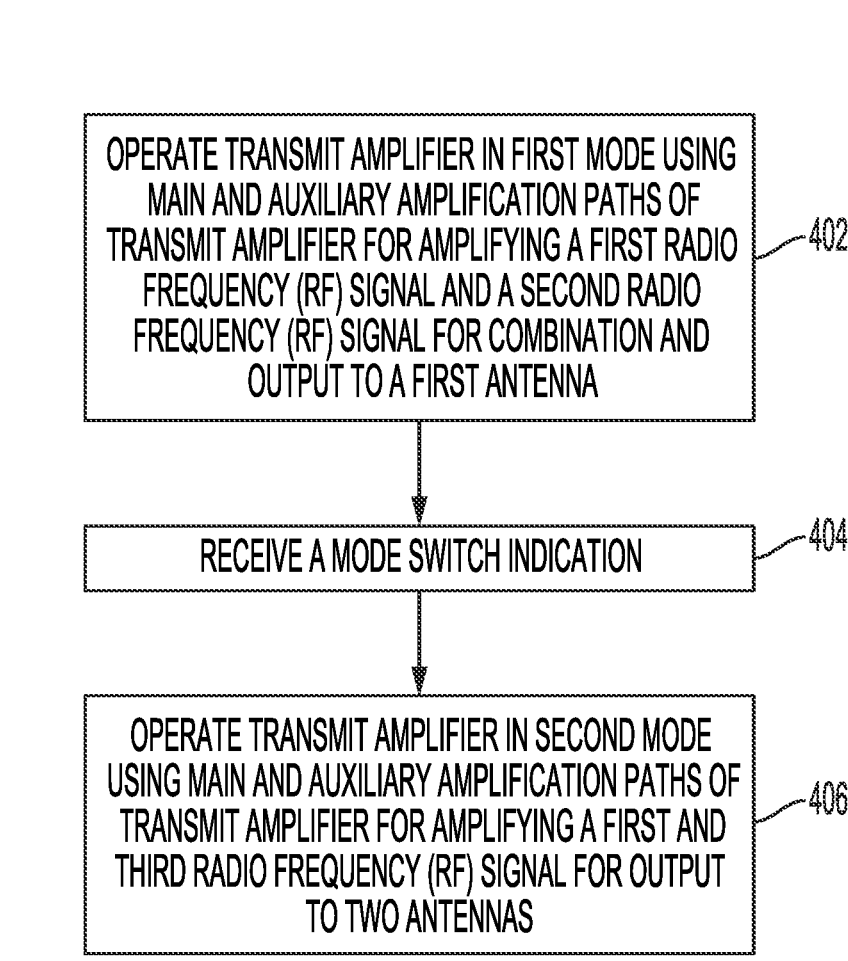

OPERATE TRANSMIT AMPLIFIER IN FIRST MODE USING MAIN AND AUXILIARY AMPLIFICATION PATHS OF TRANSMIT AMPLIFIER FOR AMPLIFYING A FIRST RADIO FREQUENCY (RF) SIGNAL AND A SECOND RADIO FREQUENCY (RF) SIGNAL FOR COMBINATION AND OUTPUT TO A FIRST ANTENNA — 402

RECEIVE A MODE SWITCH INDICATION — 404

OPERATE TRANSMIT AMPLIFIER IN SECOND MODE USING MAIN AND AUXILIARY AMPLIFICATION PATHS OF TRANSMIT AMPLIFIER FOR AMPLIFYING A FIRST AND THIRD RADIO FREQUENCY (RF) SIGNAL FOR OUTPUT TO TWO ANTENNAS — 406

FIG. 4

RECONFIGURABLE POWER AMPLIFIER

TECHNICAL FIELD

Aspects of the present disclosure relate generally to wireless communication systems, and more particularly, to radio frequency (RF) processing circuitry for wireless communication systems. Some features may enable and provide improved communications, including improved operation of RF transceivers, such as for multiple-input-multiple-output (MIMO) operation.

Introduction

Wireless communication networks are widely deployed to provide various communication services such as voice, video, packet data, messaging, broadcast, and the like. These wireless networks may be multiple-access networks capable of supporting multiple users by sharing the available network resources.

A wireless communication network may include several components. These components may include wireless communication devices, such as base stations (or node Bs) that may support communication for a number of user equipments (UEs). A UE may communicate with a base station via downlink and uplink. The downlink (or forward link) refers to the communication link from the base station to the UE, and the uplink (or reverse link) refers to the communication link from the UE to the base station.

A base station may transmit data and control information on a downlink to a UE or may receive data and control information on an uplink from the UE. On the downlink, a transmission from the base station may encounter interference due to transmissions from neighbor base stations or from other wireless radio frequency (RF) transmitters. On the uplink, a transmission from the UE may encounter interference from uplink transmissions of other UEs communicating with the neighbor base stations or from other wireless RF transmitters. This interference may degrade performance on both the downlink and uplink.

As the demand for mobile broadband access continues to increase, the possibilities of interference and congested networks grows with more UEs accessing the long-range wireless communication networks and more short-range wireless systems being deployed in communities. Research and development continue to advance wireless technologies not only to meet the growing demand for mobile broadband access, but to advance and enhance the user experience with mobile communications.

Modern wireless communication networks are sophisticated networks that involve operation on multiple frequencies and multiple frequency ranges. RF signals in different frequencies and ranges may use different components or different configurations of components to support a device operating on these wireless communication networks and maintain high signal integrity and high bandwidth across a range of possible network conditions. The duplication of components and number of supported configurations presents challenges in designing RF systems for the UEs and BSs operating on wireless communication networks.

Multiple-input-multiple-output (MIMO) operation involves the transmission and reception of data through multiple antennas as part of a single communication session. MIMO operation can improve wireless communications by providing higher bandwidth operation, even in higher noise environments. Transmission through multiple antennas often involves multiple power amplifiers, with at least one power amplifier coupled to each antenna for increasing the strength of a signal to a level appropriate for transmission in the environment.

BRIEF SUMMARY OF SOME EXAMPLES

The following summarizes some aspects of the present disclosure to provide a basic understanding of the discussed technology. This summary is not an extensive overview of all contemplated features of the disclosure and is intended neither to identify key or critical elements of all aspects of the disclosure nor to delineate the scope of any or all aspects of the disclosure. Its sole purpose is to present some concepts of one or more aspects of the disclosure in summary form as a prelude to the more detailed description that is presented later.

A reduction in the number of power amplifier modules can reduce the complexity, reduce the overall size, and reduce the cost of radio frequency (RF) circuits multiple path operations such as MIMO operation or carrier aggregation (CA) operation. Reconfigurable power amplifier modules according to embodiments of this disclosure provide multiple processing paths to allow a single power amplifier module to couple to and drive multiple antennas. The reconfigurable paths also allow the power amplifier module to be reconfigured for operation in non-MIMO (e.g., single-input-single-output (SISO) operation or single antenna transmission operation). In some embodiments, the reconfiguration of the power amplifier module may provide a higher output power for driving a single antenna than when driving multiple antennas. The reconfiguration of a power amplifier module to provide configurations for both SISO and MIMO operation in embodiments of this disclosure reduce the number of RF components in an RF circuit, reduce the complexity of the RF circuit, reduce the cost of the RF circuit and improve the power efficiency of the RF circuit.

Shortcomings mentioned here are only representative and are included to highlight problems that the inventors have identified with respect to existing devices and sought to improve upon. Aspects of devices described below may address some or all of the shortcomings as well as others known in the art. Aspects of the improved devices described herein may present other benefits than, and be used in other applications than, those described above.

In one aspect of the disclosure, an apparatus for radio frequency (RF) signal processing includes a radio frequency (RF) module comprising a first input node, a second input node, a first output node, a second output node, and a third output node, the RF module comprising a first processing path configured to couple the first input node to the first output node and a second processing path configured to couple the second input node to the second output node in a first mode and to couple the second input node to the third output node in a second mode; a combiner module configured to combine a first output signal at the first output node with a second output signal at the second output node for output at a first antenna output node; and a matching module configured to output a third output signal from the third output node for output at a second antenna output node.

In an additional aspect of the disclosure, a method includes receiving a first radio frequency input signal; processing the first radio frequency input signal in a first processing path to output a first transmit signal at a first output port; receiving a second radio frequency input signal; receiving an amplifier mode control signal; when the amplifier mode control signal indicates a first mode, processing the second radio frequency input signal in a second processing path to output a second transmit signal at a second output port; and when the amplifier mode control signal indicates a second mode, processing the second radio frequency input signal in the second processing path to output the second transmit signal at a third output port.

As used herein, a "radio frequency" signal is a signal having a frequency above baseband, which includes, in an example embodiment of a heterodyne receiver, intermediate frequency signals.

As used herein, an "intermediate frequency" signal is a RF signal that has been downconverted from another RF signal to a frequency that is above baseband, such as in an example embodiment of a heterodyne mm Wave transceiver that receives a mmWave RF signal and downconverts the mmWave RF signal to a mmWave IF signal that is further processed, such as through further downconversion, to a lower frequency RF signal or a baseband signal.

As used herein, carrier aggregation (CA) involves the combination of one or more carrier RF signals to carry a single data stream. Carrier aggregation (CA) improves the flexibility of the wireless devices and improves network utilization by allowing devices to be assigned different numbers of carriers for different periods of time based, at least in part, on historical, instantaneous, and/or predicted bandwidth use by the wireless device. Thus, when a mobile device needs additional bandwidth, additional carriers may be assigned to that wireless device, and then de-assigned and re-assigned to other mobile devices when bandwidth demands change. As carriers are assigned and de-assigned from a mobile device, the interaction of wireless signals may change. For example, different carriers in CA may be in different bands, and certain bands may have harmonics that overlap and/or otherwise interfere with certain other bands.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purposes of illustration and description, and not as a definition of the limits of the claims.

While aspects and implementations are described in this application by illustration to some examples, those skilled in the art will understand that additional implementations and use cases may come about in many different arrangements and scenarios. Innovations described herein may be implemented across many differing platform types, devices, systems, shapes, sizes, packaging arrangements. For example, aspects and/or uses may come about via integrated chip implementations and other non-module-component based devices (e.g., end-user devices, vehicles, communication devices, computing devices, industrial equipment, retail/purchasing devices, medical devices, artificial intelligence (AI)-enabled devices, etc.). While some examples may or may not be specifically directed to use cases or applications, a wide assortment of applicability of described innovations may occur. Implementations may range in spectrum from chip-level or modular components to non-modular, non-chip-level implementations and further to aggregate, distributed, or original equipment manufacturer (OEM) devices or systems incorporating one or more aspects of the described innovations. In some practical settings, devices incorporating described aspects and features may also necessarily include additional components and features for implementation and practice of claimed and described aspects. For example, transmission and reception of wireless signals necessarily includes a number of components for analog and digital purposes (e.g., hardware components including antenna, radio frequency (RF)-chains, power amplifiers, modulators, buffer, processor(s), interleaver, adders/summers, etc.). It is intended that innovations described herein may be practiced in a wide variety of devices, chip-level components, systems, distributed arrangements, end-user devices, etc. of varying sizes, shapes, and constitution.

BRIEF DESCRIPTION OF THE DRAWINGS

A further understanding of the nature and advantages of the present disclosure may be realized by reference to the following drawings. In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

FIG. 4 is a flow chart illustrating a method for operating a transceiver circuit between multiple operating modes according to some aspects of the disclosure.

Like reference numbers and designations in the various drawings indicate like elements.

DETAILED DESCRIPTION

Figure 1:
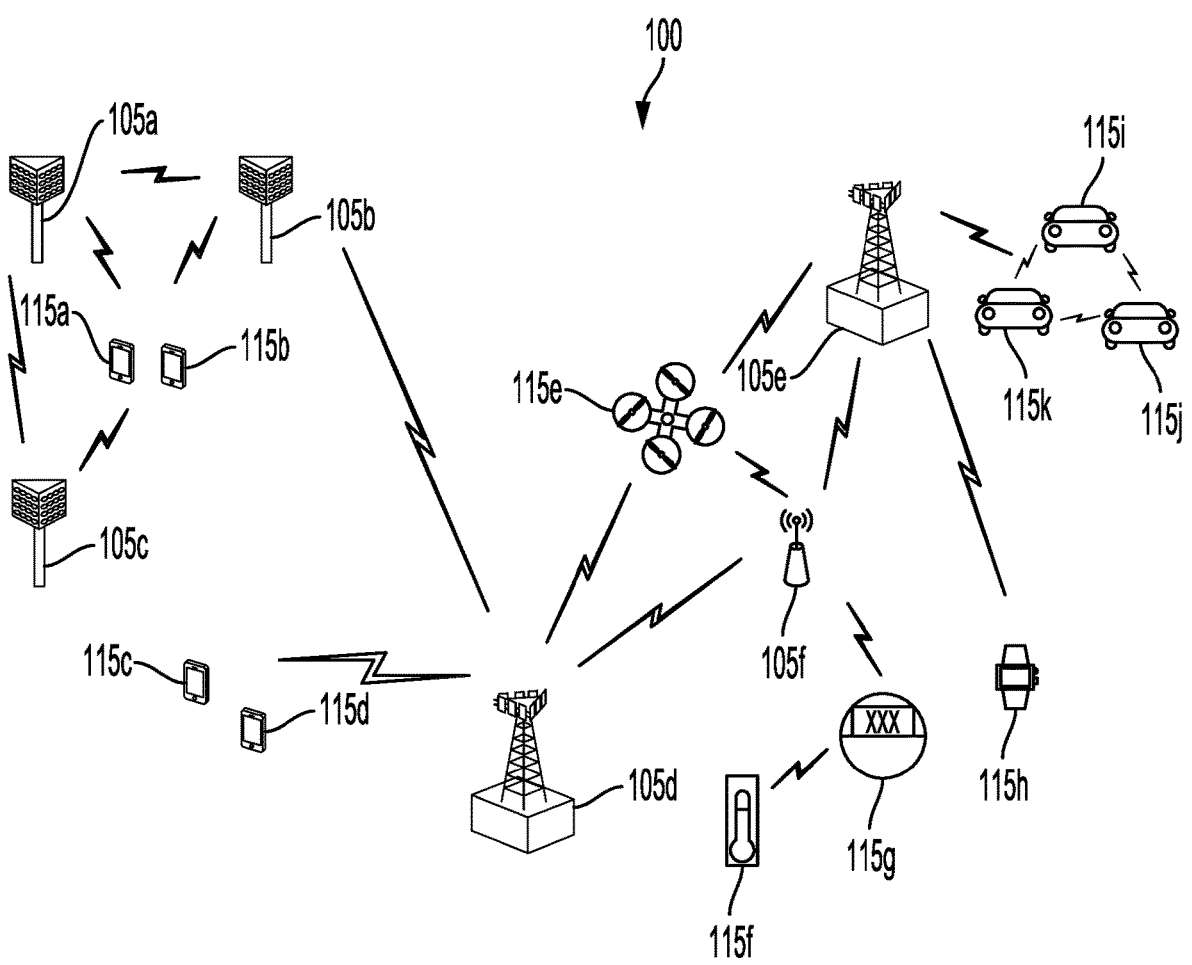
FIG. 1 is a block diagram illustrating details of an example wireless communication system according to one or more aspects.

The detailed description set forth below, in connection with the appended drawings, is intended as a description of various configurations and is not intended to limit the scope of the disclosure. Rather, the detailed description includes specific details for the purpose of providing a thorough understanding of the inventive subject matter. It will be apparent to those skilled in the art that these specific details are not required in every case and that, in some instances, well-known structures and components are shown in block diagram form for clarity of presentation.

The present disclosure provides systems, apparatus, methods, and computer-readable media that support RF signal processing including techniques for enabling single antenna transmission and multiple antenna transmission operation for two antennas through a single power amplifier module. Reconfigurable power amplifiers according to embodiments of this disclosure provide multiple processing paths to allow a single power amplifier to couple to and drive multiple antennas. Several embodiments are described for the processing paths in this disclosure. The embodiments may be driven by transmissions chains in a modem coupled to the power amplifiers.

Particular implementations of the subject matter described in this disclosure may be implemented to realize one or more of the following potential advantages or benefits. In some aspects, the present disclosure provides techniques for reducing the size, complexity, and cost of RF circuits for supporting MIMO operation in wireless devices. For example, a system according to some embodiments of the disclosure may be reconfigured to operate as a single load-modulated power amplifier (PA) having one main amplifier and one auxiliary amplifier to provide high-efficiency higher-power performance during SISO operation (such as at power levels corresponding to PC1.5, PC2, or PC3) and reconfigured to operate as two lower-power PAs during MIMO operation (while potentially leveraging Average Power Tracking (APT), Enhanced Power Tracking (EPT) or Envelope Tracking (ET) techniques). In certain embodiments described below, a RF circuit may implement a single solution that provides a high-power, high-efficiency solution using load-modulated power amplifiers (PAs) for single antenna transmission that are reconfigurable as a mid-level power, cost-effective multiple antenna transmission solution.

In various implementations, the techniques and apparatus may be used for wireless communication networks such as code division multiple access (CDMA) networks, time division multiple access (TDMA) networks, frequency division multiple access (FDMA) networks, orthogonal FDMA (OFDMA) networks, single-carrier FDMA (SC-FDMA) networks, LTE networks, GSM networks, 5th Generation (5G) or new radio (NR) networks (sometimes referred to as "5G NR" networks, systems, or devices), as well as other communications networks. As described herein, the terms "networks" and "systems" may be used interchangeably.

A CDMA network, for example, may implement a radio technology such as universal terrestrial radio access (UTRA), cdma2000, and the like. UTRA includes wideband-CDMA (W-CDMA) and low chip rate (LCR). CDMA2000 covers IS-2000, IS-95, and IS-856 standards.

A TDMA network may, for example implement a radio technology such as Global System for Mobile Communication (GSM). The 3rd Generation Partnership Project (3GPP) defines standards for the GSM EDGE (enhanced data rates for GSM evolution) radio access network (RAN), also denoted as GERAN. GERAN is the radio component of GSM/EDGE, together with the network that joins the base stations (for example, the Ater and Abis interfaces) and the base station controllers (A interfaces, etc.). The radio access network represents a component of a GSM network, through which phone calls and packet data are routed from and to the public switched telephone network (PSTN) and Internet to and from subscriber handsets, also known as user terminals or user equipments (UEs). A mobile phone operator's network may comprise one or more GERANs, which may be coupled with UTRANs in the case of a UMTS/GSM network. Additionally, an operator network may also include one or more LTE networks, or one or more other networks. The various different network types may use different radio access technologies (RATs) and RANs.

An OFDMA network may implement a radio technology such as evolved UTRA (E-UTRA), Institute of Electrical and Electronics Engineers (IEEE) 802.11, IEEE 802.16, IEEE 802.20, flash-OFDM and the like. UTRA, E-UTRA, and GSM are part of universal mobile telecommunication system (UMTS). In particular, long-term evolution (LTE) is a release of UMTS that uses E-UTRA. UTRA, E-UTRA, GSM, UMTS and LTE are described in documents provided from an organization named "3rd Generation Partnership Project" (3GPP), and cdma2000 is described in documents from an organization named "3rd Generation Partnership Project 2" (3GPP2). These various radio technologies and standards are known or are being developed. For example, the 3GPP is a collaboration between groups of telecommunications associations that aims to define a globally applicable third generation (3G) mobile phone specification. 3GPP LTE is a 3GPP project which was aimed at improving UMTS mobile phone standard. The 3GPP may define specifications for the next generation of mobile networks, mobile systems, and mobile devices. The present disclosure may describe certain aspects with reference to LTE, 4G, or 5G NR technologies; however, the description is not intended to be limited to a specific technology or application, and one or more aspects described with reference to one technology may be understood to be applicable to another technology. Additionally, one or more aspects of the present disclosure may be related to shared access to wireless spectrum between networks using different radio access technologies or radio air interfaces.

5G networks contemplate diverse deployments, diverse spectrum, and diverse services and devices that may be implemented using an OFDM-based unified, air interface. To achieve these goals, further enhancements to LTE and LTE-A are considered in addition to development of the new radio technology for 5G NR networks. The 5G NR will be capable of scaling to provide coverage (1) to a massive Internet of things (IoTs) with an ultra-high density (e.g., ~1 M nodes/km$^2$), ultra-low complexity (e.g., ~10 s of bits/sec), ultra-low energy (e.g., ~10+ years of battery life), and deep coverage with the capability to reach challenging locations; (2) including mission-critical control with strong security to safeguard sensitive personal, financial, or classified information, ultra-high reliability (e.g., ~99.9999% reliability), ultra-low latency (e.g., ~1 millisecond (ms)), and users with wide ranges of mobility or lack thereof; and (3) with enhanced mobile broadband including extreme high capacity (e.g., ~10 Tbps/km$^2$), extreme data rates (e.g., multi-Gbps rate, 100+ Mbps user experienced rates), and deep awareness with advanced discovery and optimizations.

Devices, networks, and systems may be configured to communicate via one or more portions of the electromagnetic spectrum. The electromagnetic spectrum is often subdivided, based on frequency or wavelength, into various classes, bands, channels, etc. In 5G NR two initial operating bands have been identified as frequency range designations FR1 (410 MHZ-7.125 GHZ) and FR2 (24.25 GHZ-52.6

GHZ). The frequencies between FR1 and FR2 are often referred to as mid-band frequencies. Although a portion of FR1 is greater than 6 GHZ, FR1 is often referred to (interchangeably) as a "sub-6 GHz" band in various documents and articles. A similar nomenclature issue sometimes occurs with regard to FR2, which is often referred to (interchangeably) as a "millimeter wave" (mmWave) band in documents and articles, despite being different from the extremely high frequency (EHF) band (30 GHZ-300 GHz) which is identified by the International Telecommunications Union (ITU) as a "mmWave" band.

With the above aspects in mind, unless specifically stated otherwise, it should be understood that the term "sub-6 GHz" or the like if used herein may broadly represent frequencies that may be less than 6 GHZ, may be within FR1, or may include mid-band frequencies. Further, unless specifically stated otherwise, it should be understood that the term "mmWave" or the like if used herein may broadly represent frequencies that may include mid-band frequencies, may be within FR2, or may be within the EHF band.

5G NR devices, networks, and systems may be implemented to use optimized OFDM-based waveform features. These features may include scalable numerology and transmission time intervals (TTIs); a common, flexible framework to efficiently multiplex services and features with a dynamic, low-latency time division duplex (TDD) design or frequency division duplex (FDD) design; and advanced wireless technologies, such as massive multiple input, multiple output (MIMO), robust mmWave transmissions, advanced channel coding, and device-centric mobility. Scalability of the numerology in 5G NR, with scaling of subcarrier spacing, may efficiently address operating diverse services across diverse spectrum and diverse deployments. For example, in various outdoor and macro coverage deployments of less than 3 GHZ FDD or TDD implementations, subcarrier spacing may occur with 15 kHz, for example over 1, 5, 10, 20 MHZ, and the like bandwidth. For other various outdoor and small cell coverage deployments of TDD greater than 3 GHZ, subcarrier spacing may occur with 30 kHz over 80/100 MHz bandwidth. For other various indoor wideband implementations, using a TDD over the unlicensed portion of the 5 GHz band, the subcarrier spacing may occur with 60 kHz over a 160 MHz bandwidth. Finally, for various deployments transmitting with mmWave components at a TDD of 28 GHZ, subcarrier spacing may occur with 120 kHz over a 500 MHz bandwidth.

The scalable numerology of 5G NR facilitates scalable TTI for diverse latency and quality of service (QOS) requirements. For example, shorter TTI may be used for low latency and high reliability, while longer TTI may be used for higher spectral efficiency. The efficient multiplexing of long and short TTIs to allow transmissions to start on symbol boundaries. 5G NR also contemplates a self-contained integrated subframe design with uplink or downlink scheduling information, data, and acknowledgement in the same subframe. The self-contained integrated subframe supports communications in unlicensed or contention-based shared spectrum, adaptive uplink or downlink that may be flexibly configured on a per-cell basis to dynamically switch between uplink and downlink to meet the current traffic needs.

For clarity, certain aspects of the apparatus and techniques may be described below with reference to example 5G NR implementations or in a 5G-centric way, and 5G terminology may be used as illustrative examples in portions of the description below; however, the description is not intended to be limited to 5G applications.

Moreover, it should be understood that, in operation, wireless communication networks adapted according to the concepts herein may operate with any combination of licensed or unlicensed spectrum depending on loading and availability. Accordingly, it will be apparent to a person having ordinary skill in the art that the systems, apparatus and methods described herein may be applied to other communications systems and applications than the particular examples provided.

While aspects and implementations are described in this application by illustration to some examples, those skilled in the art will understand that additional implementations and use cases may come about in many different arrangements and scenarios. Innovations described herein may be implemented across many differing platform types, devices, systems, shapes, sizes, packaging arrangements. For example, implementations or uses may come about via integrated chip implementations or other non-module-component based devices (e.g., end-user devices, vehicles, communication devices, computing devices, industrial equipment, retail devices or purchasing devices, medical devices, AI-enabled devices, etc.). While some examples may or may not be specifically directed to use cases or applications, a wide assortment of applicability of described innovations may occur. Implementations may range from chip-level or modular components to non-modular, non-chip-level implementations and further to aggregated, distributed, or original equipment manufacturer (OEM) devices or systems incorporating one or more described aspects. In some practical settings, devices incorporating described aspects and features may also necessarily include additional components and features for implementation and practice of claimed and described aspects. It is intended that innovations described herein may be practiced in a wide variety of implementations, including both large devices or small devices, chip-level components, multi-component systems (e.g., radio frequency (RF)-chain, communication interface, processor), distributed arrangements, end-user devices, etc. of varying sizes, shapes, and constitution.

FIG. 1 is a block diagram illustrating details of an example wireless communication system according to one or more aspects. The wireless communication system may include wireless network 100. Wireless network 100 may, for example, include a 5G wireless network. As appreciated by those skilled in the art, components appearing in FIG. 1 are likely to have related counterparts in other network arrangements including, for example, cellular-style network arrangements and non-cellular-style-network arrangements (e.g., device to device or peer to peer or ad hoc network arrangements, etc.).

Wireless network 100 illustrated in FIG. 1 includes a number of base stations 105 and other network entities. A base station may be a station that communicates with the UEs and may also be referred to as an evolved node B (eNB), a next generation eNB (gNB), an access point, and the like. Each base station 105 may provide communication coverage for a particular geographic area. In 3GPP, the term "cell" may refer to this particular geographic coverage area of a base station or a base station subsystem serving the coverage area, depending on the context in which the term is used. In implementations of wireless network 100 herein, base stations 105 may be associated with a same operator or different operators (e.g., wireless network 100 may include a plurality of operator wireless networks). Additionally, in implementations of wireless network 100 herein, base station 105 may provide wireless communications using one or more of the same frequencies (e.g., one or more frequency bands in licensed spectrum, unlicensed spectrum, or a combination thereof) as a neighboring cell. In some examples, an individual base station 105 or UE 115 may be operated by more than one network operating entity. In some other examples, each base station 105 and UE 115 may be operated by a single network operating entity.

A base station may provide communication coverage for a macro cell or a small cell, such as a pico cell or a femto cell, or other types of cell. A macro cell generally covers a relatively large geographic area (e.g., several kilometers in radius) and may allow unrestricted access by UEs with service subscriptions with the network provider. A small cell, such as a pico cell, would generally cover a relatively smaller geographic area and may allow unrestricted access by UEs with service subscriptions with the network provider. A small cell, such as a femto cell, would also generally cover a relatively small geographic area (e.g., a home) and, in addition to unrestricted access, may also provide restricted access by UEs having an association with the femto cell (e.g., UEs in a closed subscriber group (CSG), UEs for users in the home, and the like). A base station for a macro cell may be referred to as a macro base station. A base station for a small cell may be referred to as a small cell base station, a pico base station, a femto base station or a home base station. In the example shown in FIG. 1, base stations 105d and 105e are regular macro base stations, while base stations 105a-105c are macro base stations enabled with one of 3 dimension (3D), full dimension (FD), or massive MIMO. Base stations 105a-105c take advantage of their higher dimension MIMO capabilities to exploit 3D beamforming in both elevation and azimuth beamforming to increase coverage and capacity. Base station 105f is a small cell base station which may be a home node or portable access point. A base station may support one or multiple (e.g., two, three, four, and the like) cells.

Wireless network 100 may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. In some scenarios, networks may be enabled or configured to handle dynamic switching between synchronous or asynchronous operations.

UEs 115 are dispersed throughout the wireless network 100, and each UE may be stationary or mobile. It should be appreciated that, although a mobile apparatus is commonly referred to as a UE in standards and specifications promulgated by the 3GPP, such apparatus may additionally or otherwise be referred to by those skilled in the art as a mobile station (MS), a subscriber station, a mobile unit, a subscriber unit, a wireless unit, a remote unit, a mobile device, a wireless device, a wireless communications device, a remote device, a mobile subscriber station, an access terminal (AT), a mobile terminal, a wireless terminal, a remote terminal, a handset, a terminal, a user agent, a mobile client, a client, a gaming device, an augmented reality device, vehicular component, vehicular device, or vehicular module, or some other suitable terminology. Within the present document, a "mobile" apparatus or UE need not necessarily have a capability to move, and may be stationary. Some non-limiting examples of a mobile apparatus, such as may include implementations of one or more of UEs 115, include a mobile, a cellular (cell) phone, a smart phone, a session initiation protocol (SIP) phone, a wireless local loop (WLL) station, a laptop, a personal computer (PC), a notebook, a netbook, a smart book, a tablet, and a personal digital assistant (PDA). A mobile apparatus may additionally be an IoT or "Internet of everything" (IoE) device such as an automotive or other transportation vehicle, a satellite radio, a global positioning system (GPS) device, a global navigation satellite system (GNSS) device, a logistics controller, a drone, a multi-copter, a quad-copter, a smart energy or security device, a solar panel or solar array, municipal lighting, water, or other infrastructure; industrial automation and enterprise devices; consumer and wearable devices, such as eyewear, a wearable camera, a smart watch, a health or fitness tracker, a mammal implantable device, gesture tracking device, medical device, a digital audio player (e.g., MP3 player), a camera, a game console, etc.; and digital home or smart home devices such as a home audio, video, and multimedia device, an appliance, a sensor, a vending machine, intelligent lighting, a home security system, a smart meter, etc. In one aspect, a UE may be a device that includes a Universal Integrated Circuit Card (UICC). In another aspect, a UE may be a device that does not include a UICC. In some aspects, UEs that do not include UICCs may also be referred to as IoE devices. UEs 115a-115d of the implementation illustrated in FIG. 1 are examples of mobile smart phone-type devices accessing wireless network 100. A UE may also be a machine specifically configured for connected communication, including machine type communication (MTC), enhanced MTC (eMTC), narrowband IoT (NB-IoT) and the like. UEs 115e-115k illustrated in FIG. 1 are examples of various machines configured for communication that access wireless network 100.

A mobile apparatus, such as UEs 115, may be able to communicate with any type of the base stations, whether macro base stations, pico base stations, femto base stations, relays, and the like. In FIG. 1, a communication link (represented as a lightning bolt) indicates wireless transmissions between a UE and a serving base station, which is a base station designated to serve the UE on the downlink or uplink, or desired transmission between base stations, and backhaul transmissions between base stations. UEs may operate as base stations or other network nodes in some scenarios. Backhaul communication between base stations of wireless network 100 may occur using wired or wireless communication links.

In operation at wireless network 100, base stations 105a-105c serve UEs 115a and 115b using 3D beamforming and coordinated spatial techniques, such as coordinated multipoint (CoMP) or multi-connectivity. Macro base station 105d performs backhaul communications with base stations 105a-105c, as well as small cell, base station 105f. Macro base station 105d also transmits multicast services which are subscribed to and received by UEs 115c and 115d. Such multicast services may include mobile television or stream video, or may include other services for providing community information, such as weather emergencies or alerts, such as Amber alerts or gray alerts.

Wireless network 100 of implementations supports mission critical communications with ultra-reliable and redundant links for mission critical devices, such UE 115e, which is a drone. Redundant communication links with UE 115e include from macro base stations 105d and 105e, as well as small cell base station 105f. Other machine type devices, such as UE 115f (thermometer), UE 115g (smart meter), and UE 115h (wearable device) may communicate through wireless network 100 either directly with base stations, such as small cell base station 105f, and macro base station 105e, or in multi-hop configurations by communicating with another user device which relays its information to the network, such as UE 115*f* communicating temperature measurement information to the smart meter, UE 115*g*, which is then reported to the network through small cell base station 105*f*. Wireless network 100 may also provide additional network efficiency through dynamic, low-latency TDD communications or low-latency FDD communications, such as in a vehicle-to-vehicle (V2V) mesh network between UEs 115*i*-115*k* communicating with macro base station 105*c*.

Figure 2:
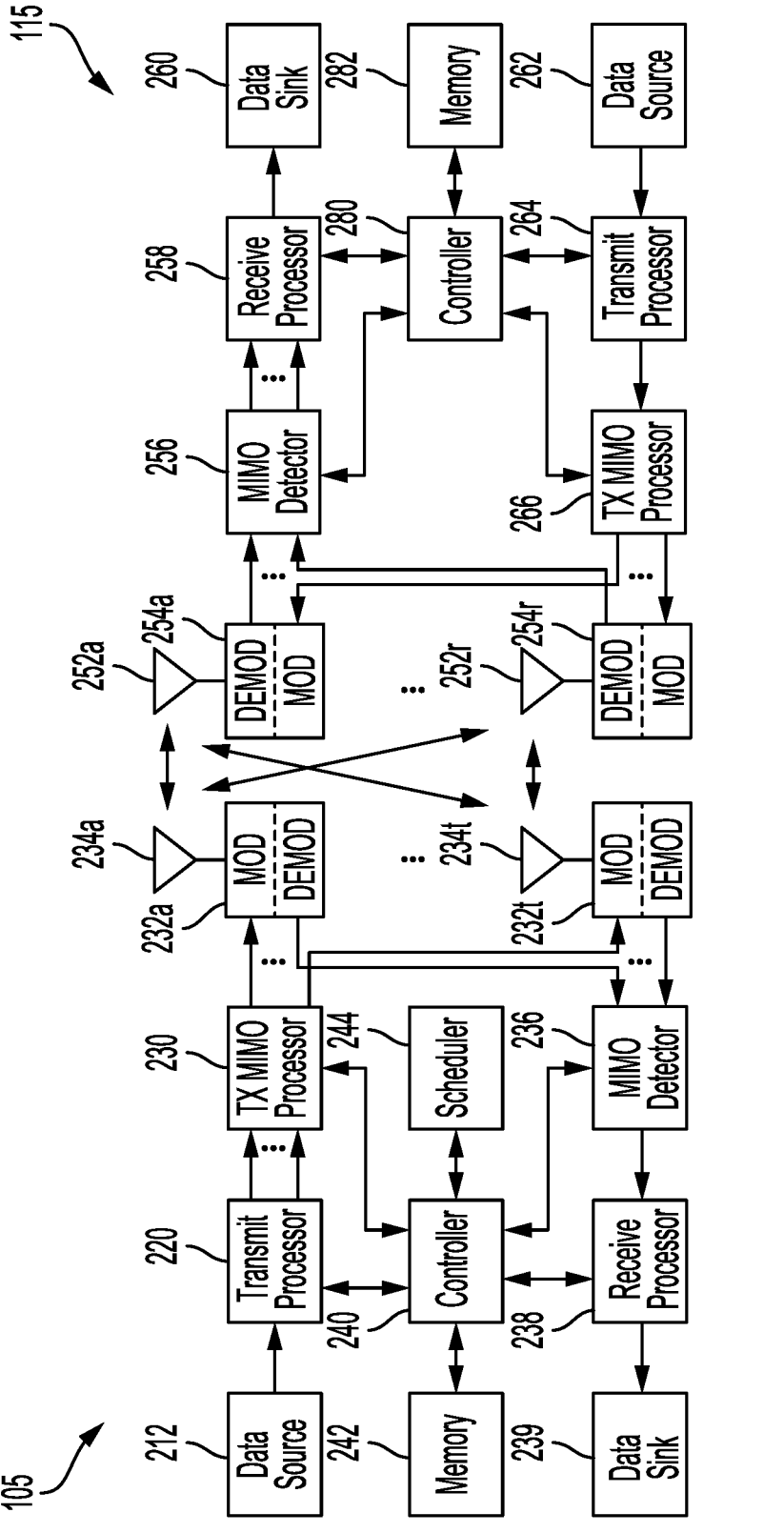
FIG. 2 is a block diagram illustrating examples of a base station and a user equipment (UE) according to one or more aspects.

FIG. 2 is a block diagram illustrating examples of base station 105 and UE 115 according to one or more aspects. Base station 105 and UE 115 may be any of the base stations and one of the UEs in FIG. 1. For a restricted association scenario (as mentioned above), base station 105 may be small cell base station 105*f* in FIG. 1, and UE 115 may be UE 115*c* or 115*d* operating in a service area of base station 105*f*, which in order to access small cell base station 105*f*, would be included in a list of accessible UEs for small cell base station 105*f*. Base station 105 may also be a base station of some other type. As shown in FIG. 2, base station 105 may be equipped with antennas 234*a* through 234*t*, and UE 115 may be equipped with antennas 252*a* through 252*r* for facilitating wireless communications.

At base station 105, transmit processor 220 may receive data from data source 212 and control information from controller 240, such as a processor. The control information may be for a physical broadcast channel (PBCH), a physical control format indicator channel (PCFICH), a physical hybrid-ARQ (automatic repeat request) indicator channel (PHICH), a physical downlink control channel (PDCCH), an enhanced physical downlink control channel (EPDCCH), an MTC phfysical downlink control channel (MPDCCH), etc. The data may be for a physical downlink shared channel (PDSCH), etc. Additionally, transmit processor 220 may process (e.g., encode and symbol map) the data and control information to obtain data symbols and control symbols, respectively. Transmit processor 220 may also generate reference symbols, e.g., for the primary synchronization signal (PSS) and secondary synchronization signal (SSS), and cell-specific reference signal. Transmit (TX) MIMO processor 230 may perform spatial processing (e.g., precoding) on the data symbols, the control symbols, or the reference symbols, if applicable, and may provide output symbol streams to modulators (MODs) 232*a* through 232*t*. For example, spatial processing performed on the data symbols, the control symbols, or the reference symbols may include precoding. Each modulator 232 may process a respective output symbol stream (e.g., for OFDM, etc.) to obtain an output sample stream. Each modulator 232 may additionally or alternatively process (e.g., convert to analog, amplify, filter, and upconvert) the output sample stream to obtain a downlink signal. Downlink signals from modulators 232*a* through 232*t* may be transmitted via antennas 234*a* through 234*t*, respectively.

At UE 115, antennas 252*a* through 252*r* may receive the downlink signals from base station 105 and may provide received signals to demodulators (DEMODs) 254*a* through 254*r*, respectively. Each demodulator 254 may condition (e.g., filter, amplify, downconvert, and digitize) a respective received signal to obtain input samples. Each demodulator 254 may further process the input samples (e.g., for OFDM, etc.) to obtain received symbols. MIMO detector 256 may obtain received symbols from demodulators 254*a* through 254*r*, perform MIMO detection on the received symbols if applicable, and provide detected symbols. Receive processor 258 may process (e.g., demodulate, deinterleave, and decode) the detected symbols, provide decoded data for UE 115 to data sink 260, and provide decoded control information to controller 280, such as a processor.

On the uplink, at UE 115, transmit processor 264 may receive and process data (e.g., for a physical uplink shared channel (PUSCH)) from data source 262 and control information (e.g., for a physical uplink control channel (PUCCH)) from controller 280. Additionally, transmit processor 264 may also generate reference symbols for a reference signal. The symbols from transmit processor 264 may be precoded by TX MIMO processor 266 if applicable, further processed by modulators 254*a* through 254*r* (e.g., for SC-FDM, etc.), and transmitted to base station 105. At base station 105, the uplink signals from UE 115 may be received by antennas 234, processed by demodulators 232, detected by MIMO detector 236 if applicable, and further processed by receive processor 238 to obtain decoded data and control information sent by UE 115. Receive processor 238 may provide the decoded data to data sink 239 and the decoded control information to controller 240.

Controllers 240 and 280 may direct the operation at base station 105 and UE 115, respectively. Controller 240 or other processors and modules at base station 105 or controller 280 or other processors and modules at UE 115 may perform or direct the execution of various processes for the techniques described herein, such as to perform or direct the execution illustrated in FIG. 5 or FIG. 6, or other processes for the techniques described herein. Memories 242 and 282 may store data and program codes for base station 105 and UE 115, respectively. Scheduler 244 may schedule UEs for data transmission on the downlink or the uplink.

In some cases, UE 115 and base station 105 may operate in a shared radio frequency spectrum band, which may include licensed or unlicensed (e.g., contention-based) frequency spectrum. In an unlicensed frequency portion of the shared radio frequency spectrum band, UEs 115 or base stations 105 may traditionally perform a medium-sensing procedure to contend for access to the frequency spectrum. For example, UE 115 or base station 105 may perform a listen-before-talk or listen-before-transmitting (LBT) procedure such as a clear channel assessment (CCA) prior to communicating in order to determine whether the shared channel is available. In some implementations, a CCA may include an energy detection procedure to determine whether there are any other active transmissions. For example, a device may infer that a change in a received signal strength indicator (RSSI) of a power meter indicates that a channel is occupied. Specifically, signal power that is concentrated in a certain bandwidth and exceeds a predetermined noise floor may indicate another wireless transmitter. A CCA also may include detection of specific sequences that indicate use of the channel. For example, another device may transmit a specific preamble prior to transmitting a data sequence. In some cases, an LBT procedure may include a wireless node adjusting its own backoff window based on the amount of energy detected on a channel or the acknowledge/negative-acknowledge (ACK/NACK) feedback for its own transmitted packets as a proxy for collisions.

Figure 3:
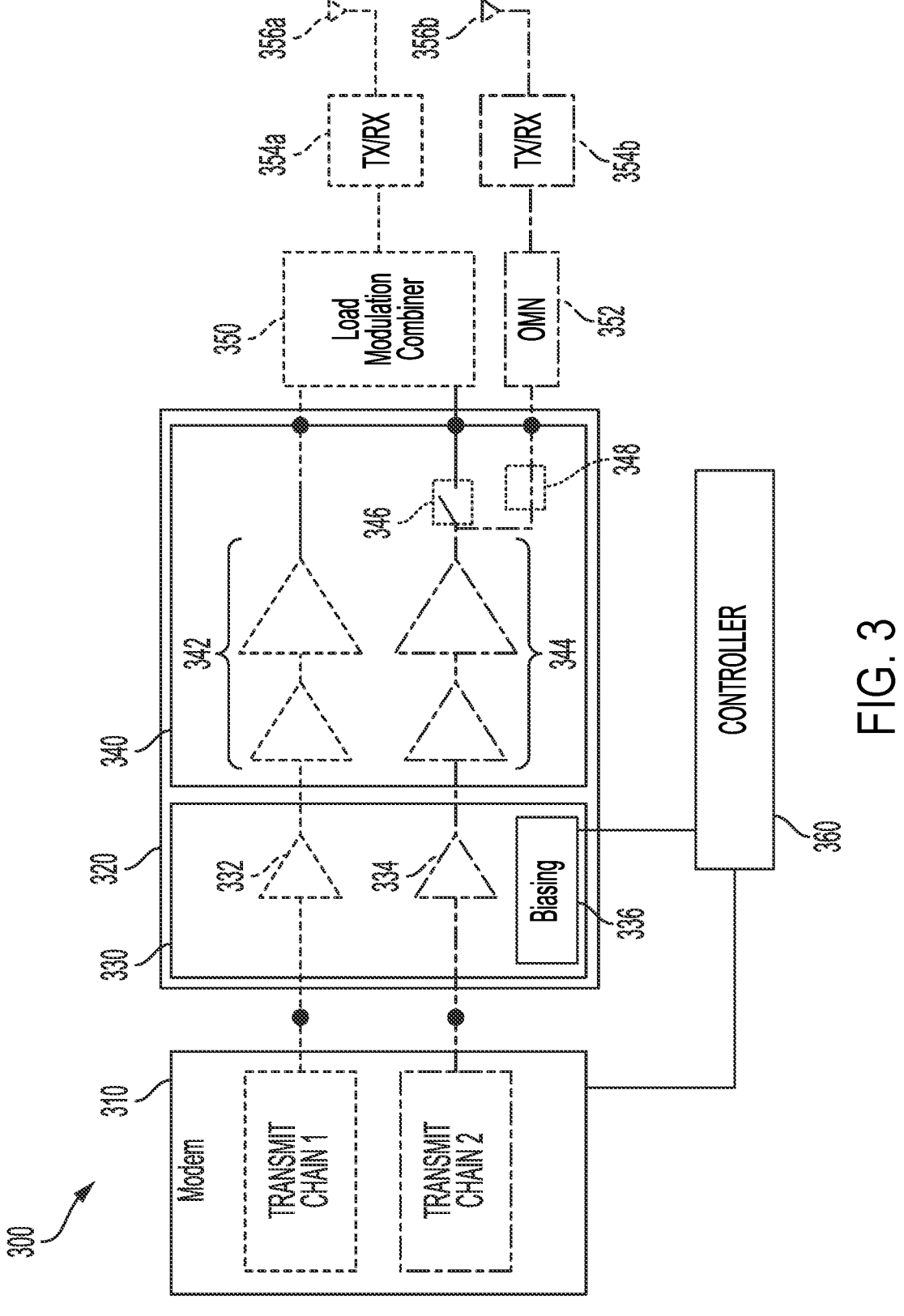
FIG. 3 is a block diagram illustrating an amplifier configuration for a transceiver circuit configured for reconfiguration between multiple operating modes according to some aspects of the disclosure.

FIG. 3 is a block diagram illustrating an amplifier configuration for a transceiver circuit configured for reconfiguration between multiple operating modes according to some aspects of the disclosure. In some embodiments, the transceiver circuit 300 may be part of a converged sub-6 Ghz and mmWave radio frequency (RF) transceiver, a sub-6 GHZ radio frequency (RF) transceiver, or a mmWave radio frequency (RF) transceiver. The transceiver circuit 300 may include RF components not shown, such as duplexers, SAW filters, switches, LNAs, and/or other transmit or receive circuits for conditioning signals. In some embodiments, the transceiver circuit may include separate circuits for conditioning or otherwise processing sub-6 GHZ signals, mmWave signals, satellite signals, and/or other signals.

The amplifier of FIG. 3 may be used to support operation in multiple operating modes such as to accommodate switching between MIMO and SISO or to accommodate switching between CA and non-CA. The configuration may improve systems and apparatuses switching between such modes by providing for reconfiguration of an amplifier circuit to accommodate different operating conditions in a network environment while reducing size and complexity of the RF components in a wireless device. Some embodiments for operating such an amplifier supporting multiple operating modes are described with reference to FIGS. 3-8. Some embodiments describe switching between MIMO operating mode and SISO operating mode. Some embodiments described switching between CA operating mode and non-CA operating mode. The described aspects of RF circuitry should be considered as supporting different operating modes and not limited to MIMO/SISO or CA/non-CA.

A transceiver circuit 300 includes a modem 310 coupled to a RF module 320. The modem 310 may include circuitry configured to process user data and control data for operating on a wireless network, such as a Wi-Fi, 4G LTE, 5G NR, 5G mmWave, 6G, or other generation wireless network. The modem 310 generates RF signals containing data and/or control information for transmission in the wireless network. The RF signals are provided to RF module 320 for processing, such as filtering and amplification, for transmission through antennas 356a-b. RF signals as used herein refer to radio frequency (RF) signals, which includes intermediate frequency (IF) signals. The modem 310 may include transceiver circuitry such as analog-to-digital converters (ADCs), digital-to-analog converters (DACs), mixers (e.g., harmonic rejection mixers (HRMs) or other mixers) to provide RF outputs. The modem 310 may also include transceiver circuit for processing received RF signals, and the transceiver circuitry may be dedicated to or shared between receive and transmit paths in the modem 310. Although shown as one block, the modem 310 may include one chip (e.g., a combination of a baseband (BB) processor and transceiver IC) or multiple chips (e.g., separate BB processor and transceiver IC or separate 5G and mmWave transceiver ICs).

The RF module 320 outputs transmit signals to antenna 356a and antenna 356b. The antenna 356a and antenna 356b may be configured in a 2×2 MIMO antenna array. In some embodiments, RF modules may be combined to provide N×N reconfigurable operation of amplifiers to support N×N MIMO operation. The RF module 320 may include a pre-amplifier module 330 and an amplifier module 340. The RF module 320 may have two input nodes coupled to two transmit chains of the modem 310. The pre-amplifier module 330 includes pre-amplifiers 322 and 334 coupled to a first input node and a second input node. The pre-amplifier module 330 outputs two RF signals to amplifier module 340.

The amplifier module 340 includes a first processing path 342 and a second processing path 344. The first processing path 342 includes one or more stages of power amplifiers for amplifying an RF input signal from the first input node for output at a first output node. The second processing path 344 includes one or more stages of power amplifiers for amplifying an RF input signal from the second input node for output at a second output node or a third output node. In some embodiments in which the amplifier module 340 implements a Doherty amplifier, the processing path 344 may refer to a peaking amplification path and the processing path 342 may refer to a main amplification path or carrier amplification path. In some such embodiments, the processing path 342 may include an amplifier with a different biasing or different class configuration than an amplifier of the processing path 344. For example, the processing path 342 may include an amplifier configured to operate as a Class AB amplifier providing gain at any power level and the processing path 344 may include an amplifier configured to operate as a Class C amplifier conducting during half of each cycle.

The amplifier module 340 also includes components to control signal paths for radio frequency signals through the amplifier module 340. Switches 346 and 348 open and close to switch the output of the second processing path 344 between the second output node and the third output node. In a first mode the switch 346 is closed and the switch 348 is open, which directs the radio frequency signal from the second input node to the second output node. In a second mode the switch 346 is open and the switch 348 is closed, which directs the radio frequency signal from the second input node to the third output node. The different modes may switch the second processing path 344 from antenna 356a to antenna 356b. The different modes of operation may correspond to different antenna transmission techniques. For example, the first mode may correspond to a single-input-single-output (SISO) operation and the second mode may correspond to a multiple-input-multiple-output (MIMO) operation.

The output of amplifier module 340 in SISO operation at the first output node and the second output node (from the processing path 342 and processing path 344, respectively) may be combined at combiner module 350 for transmission at antenna 356a. In different embodiments, the combiner module 350 may be one of or a combination of a load modulation combiners and/or other combiners implementing other combining techniques. In some embodiments, the outputs of transmission chains from modem 310 at the first and second input node are set digitally to be static or dynamic as appropriate for the combiner module 350 (e.g., Doherty, Outphasing, or other). In one embodiment, the transmit chains from the modem 310 may output signals that are 90 degrees out of phase with each other for processing in processing path 342 and processing path 344 with the combiner module 350 bringing the output of the processing path 342 and processing path 344 for combining. In other embodiments, the choice of the phase angle may be different based on other design parameters. In some embodiments, the processing path 342 and processing path 344 may process different frequency signals to support carrier aggregation (CA) operation in SISO operation. The output of the amplifier module 340 in MIMO operation may be output to two different antennas by transmitting output from the first output node through combiner module 350 to antenna 356a and transmitting output from the third output node through matching module 352 (e.g., a matching network) to antenna 356b.

In some embodiments, the RF module 320 includes an amplifier module 340 as a single load-modulated power amplifier (PA) that has one main amplifier and one auxiliary amplifier to provide high-efficiency, high-power performance during SISO operation (e.g., to achieve PC1.5, PC2, or PC3) or to provide two lower-power APT, EPT or ET PAs during MIMO operation.

A controller 360 may control operation of the RF module 320 and/or the amplifier module 340 for switching between multiple modes. For example, the controller 360 may configure the amplifier module 340 for a particular mode by controlling, directly or indirectly, the switch 346 and the switch 348. The controller 360 may additionally control other components in RF module 320. For example, the controller 360 may control biasing circuitry 336 in the pre-amplifier module 330 based on a mode of operation (e.g., first mode or second mode, SISO mode or MIMO mode) for the RF module 320. In some embodiments, the biasing circuitry 336 may also bias the power amplifiers in amplifier module 340. As another example, the controller 360 may control the combiner module 350 for combining or not combining inputs for output to the antenna 356a.

The controller 360 may configure the RF module 320 based on signals from the modem 310. For example, the modem 310 may provide a mode signal indicating a first mode when the modem 310 outputs SISO signals and indicating a second mode when the modem 310 outputs MIMO signals. The modem 310 may measure a signal-to-noise ratio (SNR) for signals communicated in the environment around a wireless device including the RF module 320. When the SNR is low, the modem 310 may instruct the controller 360 to configure the RF module 320 for SISO operation. The higher-power output capable in the SISO operation improves throughput and/or reliability in higher-noise environments and the use of the load modulation combiner reduces current consumption. When the SNR is high, the modem 310 may instruct the controller 360 to configure the RF module 320 for MIMO operation. The multiple-antenna output capable in the MIMO operation may improve throughput and/or reliability in lower-noise environments. High SNR environments may allow operation with lower-power signals due to lower interference, such that the RF module 320 may be configured to output multiple lower power signals to multiple antennas to achieve higher transmission throughput in low noise environments. Low SNR environments may benefit from higher power signals such that the RF module 320 may be configured to output a single higher-power signal to a single antenna, which may achieve higher transmission throughput in higher-noise environments. In some embodiments, the criteria for switching between operating modes (e.g., MIMO/SISO or CA/non-CA) may include at least one of a signal to noise ratio (SNR) as described above, network-level parameters, and/or other criteria indicating wireless network environment conditions.

Additional components may be included in the RF module 320. For example, the RF module 320 may include transceiver components 354a for driving a radio frequency signal to the antenna 356a. As another example, the RF module 320 may include transceiver components 354b for driving a radio frequency signal to the antenna 356b.

The RF module 320 may be configured as one laminate package comprising one or more integrated circuits on one or more dies with one or more external components. For example, the laminate package may include a first integrated circuit built on a first semiconductor die comprising the amplifier module 340. The laminate package may include a second integrated circuit built on a second semiconductor die comprising the pre-amplifier module 330. In some embodiments, the first and second semiconductor dies may have different semiconductor materials. For example, the amplifier module 340 may be constructed on a Gallium Arsenide (GaAs) substrate and the pre-amplifier module 330 may be constructed on a Silicon (Si) substrate. Although certain components are illustrated in some embodiments as grouped together to be constructed on a common semiconductor die, embodiments of this disclosure should be understood to not be limited to the described physical layouts and may include embodiments in which different components are manufactured in different arrangements on same or different semiconductor dies of same or different substrate materials.

FIG. 4 is a flow chart illustrating a method for operating a transceiver circuit between multiple operating modes according to some aspects of the disclosure. A method 400 may be performed by, for example, the controller 360 of FIG. 3 for configuring RF components, such as RF module 320. Method 400 may include, at block 402, operating a transmit amplifier, such as amplifier module 340, in a first mode using a main and an auxiliary amplification path of the transmit amplifier for amplifying a first radio frequency signal and a second radio frequency signal for combination and output to a first antenna. The auxiliary amplification path may be through, for example, second processing path 344 having a second power amplifier (which may include a plurality of series-coupled amplifiers) of lower-power capability than a first power amplifier (which may include a plurality of series-coupled amplifiers) of first processing path 342.

The operation of block 402 may be performed by a series of operations in the RF module. Block 402 may include, for example, receiving a first radio frequency input signal and processing the first radio frequency input signal in a first processing path to output a first transmit signal at a first output port. Block 402 may also include receiving a second radio frequency input signal and receiving an amplifier mode control signal. When the amplifier mode control signal indicates a first mode, processing the second radio frequency input signal in a second processing path to output a second transmit signal at a second output port. When the amplifier mode control signal indicates a second mode, processing the second radio frequency input signal in the second processing path to output the second transmit signal at a third output port.

At block 404, a mode switch indication is received. For example, the controller 360 may be instructed to reconfigure the RF module 320 for MIMO operation. The MIMO operation may coincide with higher-SNR conditions in the environment around the wireless device. Additional or different criteria may be used to trigger the switch between modes at block 404. For example, a fill level of a transmission queue or transmission buffer may be used to switch to a higher-bandwidth mode (such as MIMO operation) or a lower-power, efficient mode (such as SISO operation). As another example, an active application supplying data into the transmission queue or transmission buffer may provide metadata indicating a desire to switch to a higher-bandwidth mode (such as MIMO operation) or a lower-power, efficient mode (such as SISO operation).

At block 406, the transmit amplifier is operated in a second mode using the main and auxiliary amplification paths of the transmit amplifier for amplifying two RF signals for output to two antennas. For example, with reference to FIG. 3, the first processing path 342 may amplify a second radio frequency signal for output to the antenna 356a and the second processing path 344 may amplify a third radio frequency signal for output to the antenna 356b. Operations of block 406 may include operations described with reference to block 402 such as receiving a first radio frequency input signal and processing the first radio frequency input signal in a first processing path to output a first transmit signal at a first output port, receiving a second radio frequency input signal, and receiving an amplifier mode control signal. When the amplifier mode control signal indicates a first mode, processing the second radio frequency input signal in a second processing path to output a second transmit signal at a second output port. When the amplifier mode control signal indicates a second mode, processing the second radio frequency input signal in the second processing path to output the second transmit signal at a third output port.

Figure 5:
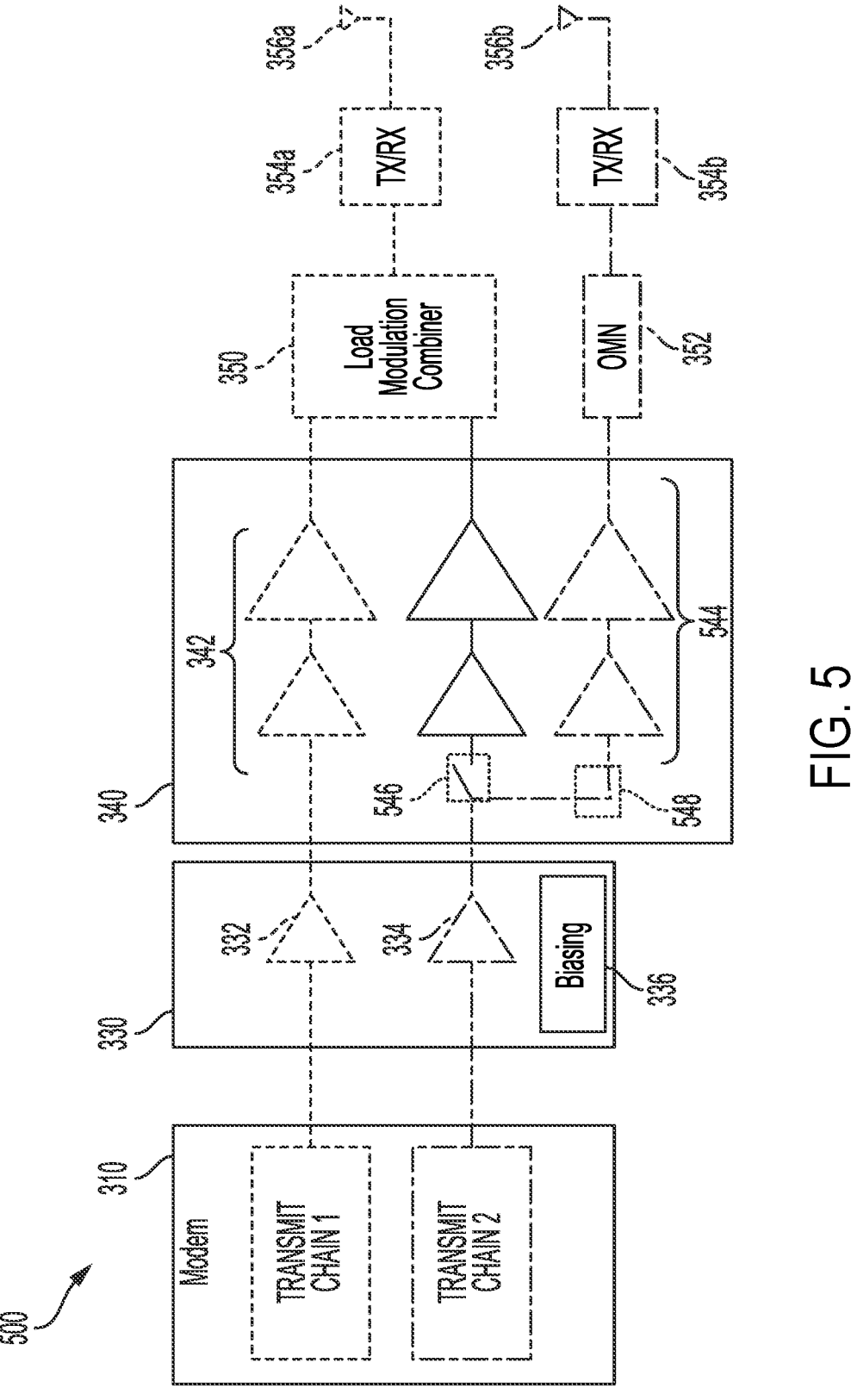
FIG. 5 is a block diagram illustrating another amplifier configuration for a transceiver circuit configured for reconfiguration between multiple operating modes according to some aspects of the disclosure.

Other circuitry configurations may be used for switching the amplifier module between multiple modes to provide a mapping of the two input nodes to the two of the three output nodes. In FIG. 3, the switch 346 and switch 348 are coupled at an output of the processing path 342 and the processing path 344, respectively. A configuration with switches at an input to the processing paths is shown in FIG. 5. FIG. 5 is a block diagram illustrating another amplifier configuration for a transceiver circuit configured for reconfiguration between multiple operating modes according to some aspects of the disclosure. Transceiver circuit 500 includes switch 546 and switch 548. Switch 546 couples the second input node to the second processing path 344 for output to the second output node for transmission on antenna 356a. Switch 548 couples the third input node to a third processing path 544 for output to the third output node for transmission on antenna 356b. In a first mode (such as SISO operation), the switch 546 may be closed and the switch 548 is open. The first processing path 342 and the second processing path 344 are active in the first mode to output signals on the first output node and the second output node for combining by combiner module 350 and output to antenna 356a. In a second mode (such as MIMO operation), the switch 546 is open and the switch 548 is closed. The first processing path 342 and the third processing path 544 are active in the second mode to output signals on the first output node and the third output node for output on antenna 356a and antenna 356b, respectively. The switches 546 and 548 at the input of the processing paths 342, 344, and 544 may be sized smaller than at the output of processing paths 342, 344 because the signal power is smaller prior to amplification in the amplification module 340. This provides a trade-off of the size of the switches at the output of the auxiliary amplifier with the size of adding third processing path 544 with switches at the input.

Figure 6:
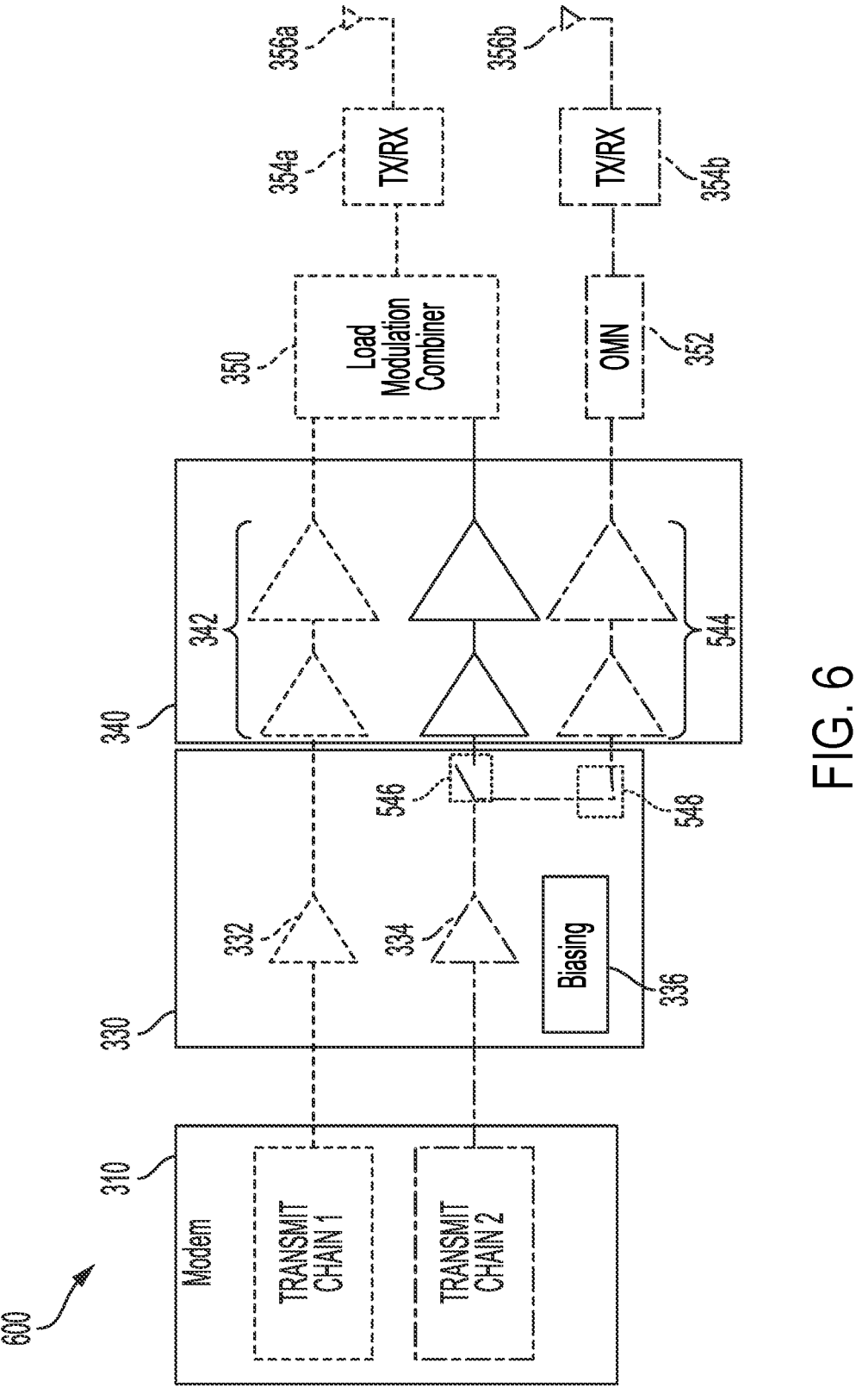
FIG. 6 is a block diagram illustrating a further amplifier configuration for a transceiver circuit configured for reconfiguration between multiple operating modes according to some aspects of the disclosure.

The switches for configuring the RF module 520 are included in amplifier module 340 in FIG. 5. The switches may alternatively be included elsewhere in RF module 320. For example, the switches may be included in pre-amplifier module 330 as shown in FIG. 6. FIG. 6 is a block diagram illustrating a further amplifier configuration for a transceiver circuit configured for reconfiguration between multiple operating modes according to some aspects of the disclosure. Transceiver circuit 600 includes switch 546 and switch 548 in pre-amplifier module 330. This provides a trade-off of the size of the switches at the output of the auxiliary amplifier with the size of adding third processing path 544 with switches in the Silicon pre-amplifier module 330 rather than in GaAs amplifier module 340.

Figure 7:
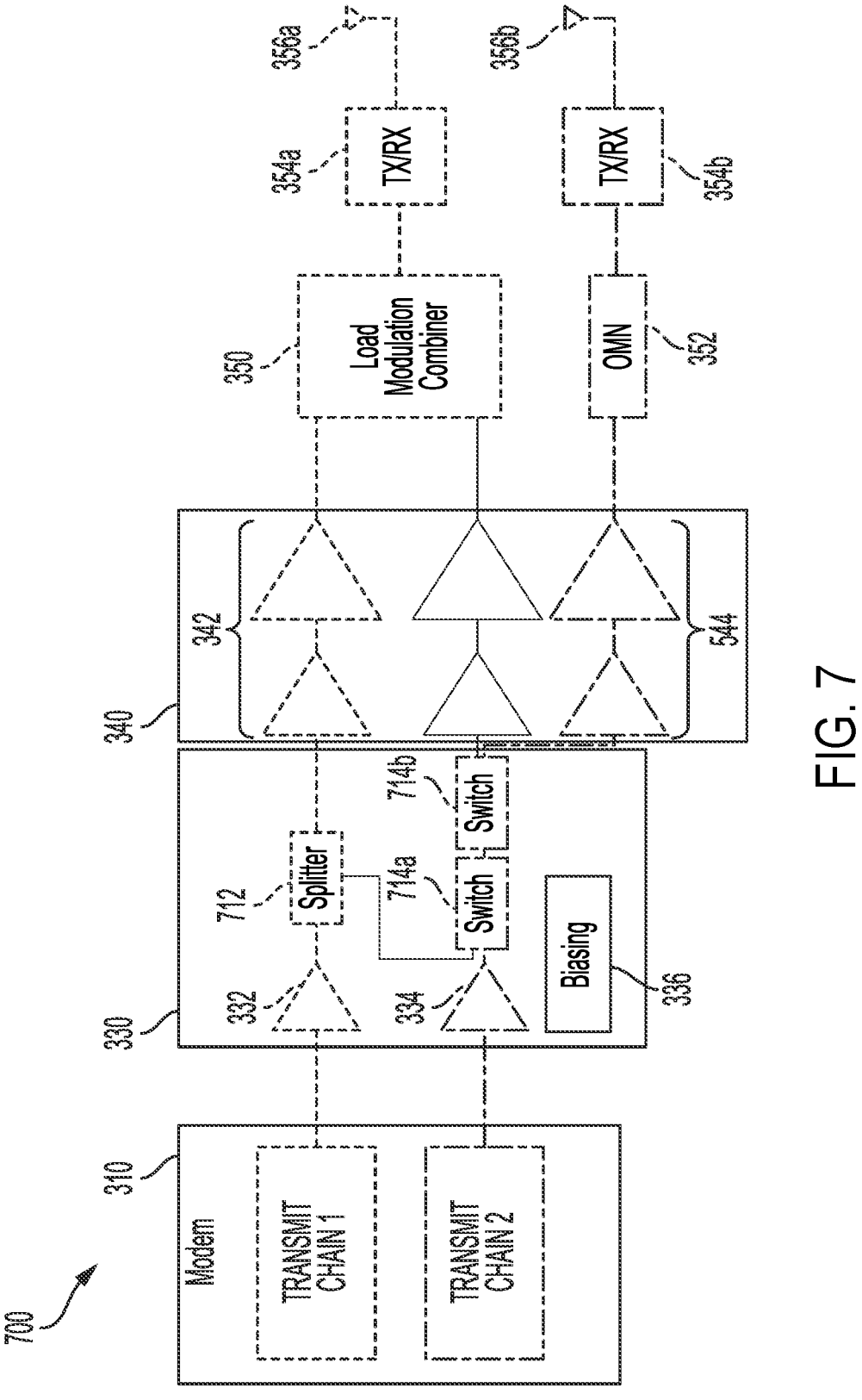
FIG. 7 is a block diagram illustrating another amplifier configuration for a transceiver circuit configured for reconfiguration between multiple operating modes according to some aspects of the disclosure.

Other components may be used for switching the operating mode of the RF module 320. For example, a splitter may be combined with switches to provide reconfiguration capability as shown in FIG. 7. FIG. 7 is a block diagram illustrating another amplifier configuration for a transceiver circuit configured for reconfiguration between multiple operating modes according to some aspects of the disclosure. A splitter 712 coupled to the first input node may provide a copy of the radio frequency signal at the first input node for processing in the second processing path 344 in parallel with processing in the first processing path 342. The output of splitter 712 is provided to switch 714a, which selects between the output of the splitter 712 and the second input node for input to the second processing path 344 or the third processing path 544. Switch 714b coupled to the switch 714a may select between outputting the output of switch 714a to the second processing path 344 or the third processing path 544.

Embodiments implementing aspects of FIG. 7 allow the SISO mode to be enabled through a single transmit chain by implementing a passive splitter in Silicon pre-amplifier module 330 followed by a switch to select the processing path in the GaAs amplifier module 340. In MIMO mode, the second transmit chain can be enabled as required. The splitter 712 may be designed to provide static or dynamic phase-shift in analog manner as a traditional system.

Figure 8:
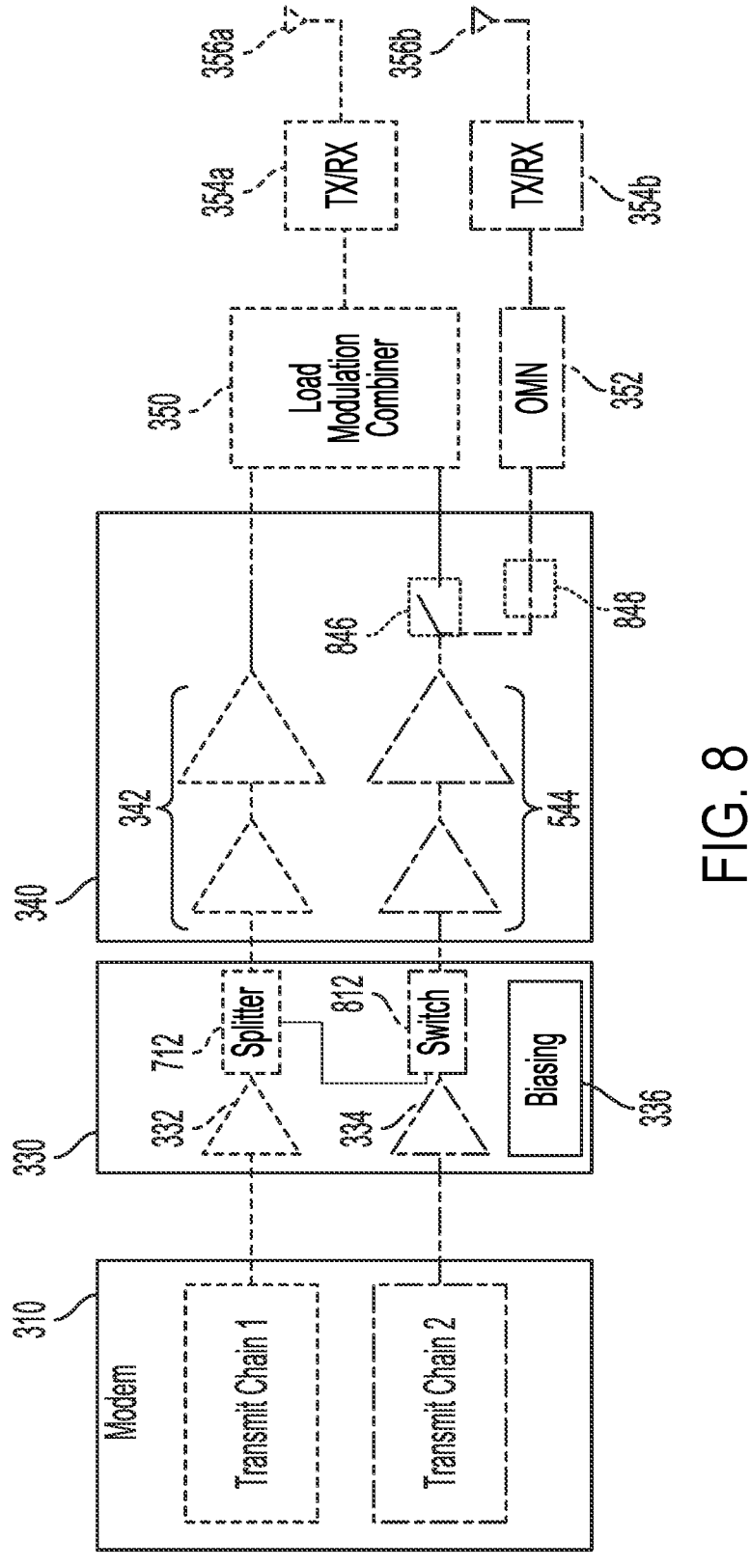
FIG. 8 is a block diagram illustrating another amplifier configuration for a transceiver circuit configured for reconfiguration between multiple operating modes according to some aspects of the disclosure.

The switch 714b may be replaced in some embodiments with switches at the output of the second processing path to couple the split RF signal to the first antenna 356a or second antenna 356b. FIG. 8 is a block diagram illustrating another amplifier configuration for a transceiver circuit configured for reconfiguration between multiple operating modes according to some aspects of the disclosure. The splitter 712 may split an RF signal at the first input node between the first processing path 342 and the second processing path 344. The switch 812 may select between the output of the splitter 712 and the second input node for amplification in second processing path 344. The output of the second processing path 344 is switched between the first antenna 356 and the second antenna 356b.

Figure 9:
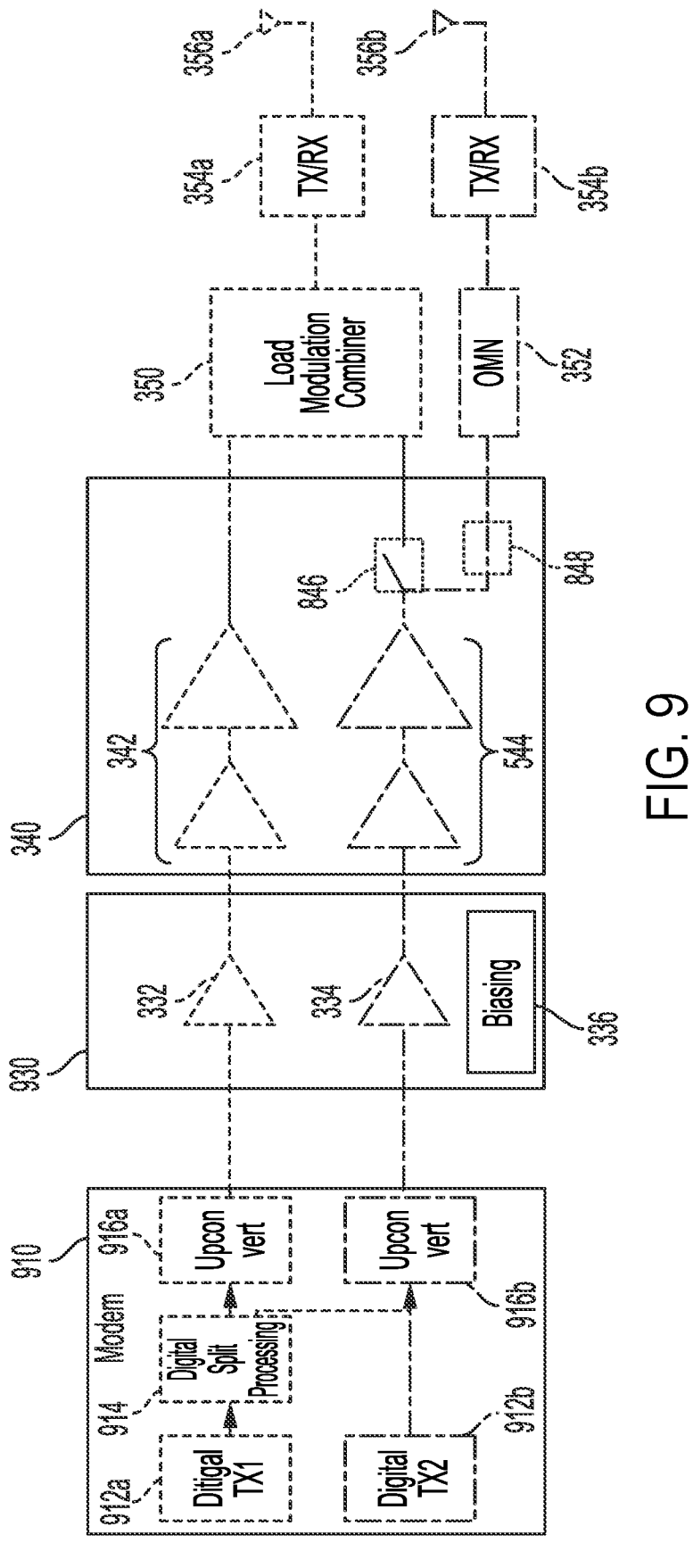
FIG. 9 is a block diagram illustrating an amplifier configuration with a digital split in the modem according to some aspects of the disclosure.

In some embodiments, the operational mode switch may be performed through a single transmission chain by implementing a digital splitter in the modem and upconverting the digitally split signal for output to a first and second input node of the RF system. FIG. 9 is a block diagram illustrating an amplifier configuration with a digital split in the modem according to some aspects of the disclosure. The modem 910 includes a first digital transmission signal processor 912a and a second digital transmission signal processor 912b. A digital splitter 914 receives the output of the first transmission signal processor 912a and may be enabled to output the signal to both a first upconverter 916a and a second upconverter 916b. In a single antenna output mode, the digital splitter 914 is enabled to output a common signal through the first processing path 342 and the second processing path 344 for combination at combiner 350. In a multiple antenna output mode (e.g., MIMO or CA), the digital splitter 914 is disabled such that the processors 912a and 912b may output different signals to upconverters 916a and 916b, respectively, for processing in processing paths 342 and 344, respectively. A pre-amplifier module 930 coupled to the modem 910 may include no further splitting circuitry, which may reduce the size and complexity of transceiver circuits implementing digital splitting as shown in FIG. 9.

As described above, embodiments illustrated in FIG. 3, FIG. 5, FIG. 6, and FIG. 9 use digital splitting in either one or both of the different digital transmission signal processing paths of the modem, and FIG. 7 and FIG. 8 use analog/RF splitters after the pre-amplifier module.

Embodiments of a transceiver circuit for power amplification of radio frequency signals for driving a MIMO array of antennas provide power output improvement, efficiency improvement, and area improvement. Higher-power output in SISO operation provided by power amplifier modules may be useful when operating on the N41 band. N41 band has a requirement for PC1.5 (29 dBm) in addition to PC2 (26 dBm) and PC3 (23 dBm). The power amplifier module with multiple processing paths may provide a size reduction because the GaAs size for the power module is reduced from 2× to ~1.5× including switches. Likewise, the pre-amplifier module may provide a size reduction because the controller is reduced to one from two and certain circuitry, such as biasing circuitry in the pre-amplifier module, is not repeated. The size reduction achieved in the power module and/or pre-amplification module may not require much larger.

In one or more aspects, techniques for supporting wireless communications, such as on multiple frequency bands, may include additional aspects, such as any single aspect or any combination of aspects described below or in connection with one or more other processes or devices described elsewhere herein. In a first aspect, supporting wireless communication may include an apparatus with power amplifiers for MIMO operation. Additionally, the apparatus may perform or operate according to one or more aspects as described below. In some implementations, the apparatus includes a wireless device, such as a UE or a base station (BS). In some implementations, the apparatus may include at least one processor, and a memory coupled to the processor. The processor may be configured to perform operations described herein with respect to the apparatus, including operations described herein with respect to methods of operating a wireless device. In some other implementations, the apparatus may include a non-transitory computer-readable medium having program code recorded thereon and the program code may be executable by a computer for causing the computer to perform operations described herein with reference to the apparatus. In some implementations, the apparatus may include one or more means configured to perform operations described herein. In some implementations, a method of wireless communication may include one or more operations described herein with reference to the apparatus.

In a first aspect, supporting wireless communication may include an apparatus configured to provide a reconfigurable processing path for supporting multiple operating modes (e.g., MIMO/SISO, CA/non-CA). The apparatus may include a radio frequency (RF) module comprising a first input node, a second input node, a first output node, a second output node, and a third output node, the RF module comprising a first processing path configured to couple the first input node to the first output node; and a second processing path configured to couple the second input node to the second output node in a first mode and to couple the second input node to the third output node in a second mode; along with a combiner module configured to combine a first output signal at the first output node with a second output signal at the second output node for output at a first antenna output node and a matching module configured to output a third output signal from the third output node for output at a second antenna output node.

In a second aspect, in combination with the first aspect, the apparatus further includes a controller coupled to the RF module and configured to configure the RF module in the first mode for single-input-single-output (SISO) operation and to configure the RF module in the second mode for multiple-input-multiple-output (MIMO) operation.

In a third aspect, in combination with one or more of the first aspect or the second aspect, the apparatus further includes a first antenna coupled to the first output node and a second antenna coupled to the third output node, wherein the first antenna and the second antenna are configured in a 2×2 MIMO antenna array.

In a fourth aspect, in combination with one or more of the first aspect through the third aspect, the apparatus further includes a modem configured to output a first radio frequency input signal to the first input node and to output a second radio frequency input signal to the second input node, wherein the modem operates the controller to select between the first mode and the second mode based on a signal to noise ratio (SNR) and configurations received from one or more network-level parameters.

In a fifth aspect, in combination with one or more of the first aspect through the fourth aspect, the RF module includes a first amplifier coupled to the first input node and the first output node and configured to amplify a first radio frequency input signal at the first input node for output to the first output node; and a second amplifier coupled to the second input node, the second output node, and the third output node and configured to amplify a second radio frequency input signal at the second input node for output to the second output node or the third output node.

In a sixth aspect, in combination with one or more of the first aspect through the fifth aspect, the apparatus further includes a first switch coupled between the second amplifier and the second output node; and a second switch coupled between the second amplifier and the third output node, wherein: the first switch is closed and the second switch is open in the first mode, and the first switch is open and the second switch is closed in the second mode.

In a seventh aspect, in combination with one or more of the first aspect through the sixth aspect, the RF module includes a first amplifier coupled to the first input node and the first output node and configured to amplify a first radio frequency input signal at the first input node for output to the first output node; a second amplifier coupled to the second input node and the second output node and configured to amplify a second radio frequency input signal at the second input node for output to the second output node; and a third amplifier coupled to the second input node and the third output node and configured to amplify the second radio frequency input signal at the second input node for output to the third output node.

In an eighth aspect, in combination with one or more of the first aspect through the seventh aspect, the apparatus further includes a first switch coupled between the second input node and the second amplifier; and a second switch coupled between the second input node and the third amplifier, wherein: the first switch is closed and the second switch is open in the first mode, and the first switch is open and the second switch is closed in the second mode.

In a ninth aspect, in combination with one or more of the first aspect through the eighth aspect, the apparatus further includes a pre-amplifier module comprising a first pre-amplifier and a second pre-amplifier, wherein the first switch and the second switch are included in the pre-amplifier module.

In a tenth aspect, in combination with one or more of the first aspect through the ninth aspect, the first amplifier and the second amplifier are included in an amplifier module comprising a first semiconductor die, and wherein the pre-amplifier module comprises a second semiconductor die.

In an eleventh aspect, in combination with one or more of the first aspect through the tenth aspect, the first semiconductor die comprises a Gallium Arsenide (GaAs) substrate and the second semiconductor die comprises a Silicon (Si) substrate.

In a twelfth aspect, in combination with one or more of the first aspect through the eleventh aspect, the first processing path comprises a splitter coupled to the second processing path, and wherein in the first mode the second processing path couples the splitter to the second output node and in the second mode the second processing path couples the second input node to the third output node.

In a thirteenth aspect, in combination with one or more of the first aspect through the twelfth aspect, the first processing path comprises a first amplifier, and the second processing path comprises: a second amplifier coupled between the splitter and the second output node; and a third amplifier coupled between the second input node and the third output node.

In a fourteenth aspect, in combination with one or more of the first aspect through the thirteenth aspect, the second processing path comprises at least one switch coupled between the splitter and the second output node, wherein the at least one switch is configured to couple the splitter to the second output node when the RF module is configured for single antenna operation and to couple the second input node to the third output node when the RF module is configured for multiple antenna operation.

In a fifteenth aspect, in combination with one or more of the first aspect through the fourteenth aspect, the first processing path comprises a first amplifier, and the second processing path comprises a second amplifier coupled to the splitter and to the second input node; a first switch coupled between the second amplifier and the second output node; and a second switch coupled between the second amplifier and the third output node, wherein in the first mode the first switch is closed and the second switch is open, and in the second mode the first switch is open and the second switch is closed.

In a sixteenth aspect, in combination with one or more of the first aspect through the fifteenth aspect, the apparatus further includes a controller coupled to the RF module and configured to configure the RF module in the first mode for single antenna operation and to configure the RF module in the second mode for multiple antenna operation.

In a seventeenth aspect, in combination with one or more of the first aspect through the sixteenth aspect, the apparatus may further include a modem coupled to the first input node and the second input node, wherein the modem comprises a digital splitter coupled to both a first transmit chain configured to output a first RF signal to the first input node and a second transmit chain configured to output a second RF signal to the second input node.

In an eighteenth aspect, in combination with one or more of the first aspect through the seventeenth aspect, the RF module comprises a GaAs semiconductor substrate.

In a nineteenth aspect, in combination with one or more of the first aspect through the eighteenth aspect, the apparatus further includes a pre-amplifier module to the first input node and the second input node, wherein the pre-amplifier module comprises a Si semiconductor substrate.

In a twentieth aspect, in combination with one or more of the first aspect through the nineteenth aspect, the first processing path comprises a first amplifier having a first power capability and the second processing path comprises a second amplifier having a second power capability equal to or lower than the first power capability.

In a twenty-first aspect, alone or in combination with one or more of the first aspect through the twentieth aspect, a method includes receiving a first radio frequency input signal; processing the first radio frequency input signal in a first processing path to output a first transmit signal at a first output port; receiving a second radio frequency input signal; receiving an amplifier mode control signal; when the amplifier mode control signal indicates a first mode, processing the second radio frequency input signal in a second processing path to output a second transmit signal at a second output port; and when the amplifier mode control signal indicates a second mode, processing the second radio frequency input signal in the second processing path to output the second transmit signal at a third output port.

In a twenty-second aspect, in combination with one or more of the first aspect through the twenty-first aspect, the first mode corresponds to single-input-single-output (SISO) operation.

In a twenty-third aspect, in combination with one or more of the first aspect through the twenty-second aspect, the method further includes, when the amplifier mode control signal indicates the first mode, combining the first transmit signal and the second transmit signal for transmission on a first antenna.

In a twenty-fourth aspect, in combination with one or more of the first aspect through the twenty-third aspect, the second mode corresponds to multiple-input-multiple-output (MIMO) operation.

In a twenty-fifth aspect, in combination with one or more of the first aspect through the twenty-fourth aspect, the method further includes, when the amplifier mode control signal indicates the second mode, outputting the second transmit signal for transmission on a second antenna simultaneously with outputting a third transmit signal on the first antenna.

In a twenty-sixth aspect, alone or in combination with one or more of the first aspect through the twenty-fifth aspect, an apparatus includes a memory storing processor-readable code; and at least one processor coupled to the memory, the at least one processor configured to execute the processor-readable code to cause the at least one processor to switch an amplifier module between a first mode and a second mode for amplifying transmit signals for output to an array of antennas such that the amplifier module is configured for: receiving a first radio frequency input signal; processing the first radio frequency input signal in a first processing path to output a first transmit signal at a first output port; receiving a second radio frequency input signal; receiving an amplifier mode control signal; when the amplifier mode control signal indicates the first mode, processing the second radio frequency input signal in a second processing path to output a second transmit signal at a second output port; and when the amplifier mode control signal indicates the second mode, processing the second radio frequency input signal in the second processing path to output the second transmit signal at a third output port.

In a twenty-seventh aspect, in combination with one or more of the first aspect through the twenty-sixth aspect, the first mode corresponds to single-input-single-output (SISO) operation.

In a twenty-eighth aspect, in combination with one or more of the first aspect through the twenty-seventh aspect, the at least one processor switches the amplifier module such that, when the amplifier mode control signal indicates the first mode, combining the first transmit signal and the second transmit signal for transmission on a first antenna.

In a twenty-ninth aspect, in combination with one or more of the first aspect through the twenty-eighth aspect, the second mode corresponds to multiple-input-multiple-output (MIMO) operation.

In a thirtieth aspect, in combination with one or more of the first aspect through the twenty-ninth aspect, the at least one processor switches the amplifier module such that, when the amplifier mode control signal indicates the second mode, outputting the second transmit signal for transmission on a second antenna simultaneously with outputting a third transmit signal on the first antenna.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Components, the functional blocks, and the modules described herein with respect to FIGS. 1-9 include processors, electronics devices, hardware devices, electronics components, logical circuits, memories, software codes, firmware codes, among other examples, or any combination thereof. Software shall be construed broadly to mean instructions, instruction sets, code, code segments, program code, programs, subprograms, software modules, application, software applications, software packages, routines, subroutines, objects, executables, threads of execution, procedures, and/or functions, among other examples, whether referred to as software, firmware, middleware, microcode, hardware description language or otherwise. In addition, features discussed herein may be implemented via specialized processor circuitry, via executable instructions, or combinations thereof.

Those of skill in the art that one or more blocks (or operations) described with reference to FIGS. 3 and 4 may be combined with one or more blocks (or operations) described with reference to another of the figures. For example, one or more blocks (or operations) of FIG. 3 may be combined with one or more blocks (or operations) of FIG. 1. As another example, one or more blocks associated with FIG. 4 may be combined with one or more blocks (or operations) associated with FIG. 1. Additionally, or alternatively, one or more operations described above with reference to FIGS. 1-4 may be combined with one or more operations described with reference to FIGS. 5-9.

Those of skill in the art would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure. Skilled artisans will also readily recognize that the order or combination of components, methods, or interactions that are described herein are merely examples and that the components, methods, or interactions of the various aspects of the present disclosure may be combined or performed in ways other than those illustrated and described herein.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, or, any conventional processor, controller, microcontroller, or state machine. In some implementations, a processor may be implemented as a combination of computing devices, such as a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also may be implemented as one or more computer programs, which is one or more modules of computer program instructions, encoded on a computer storage media for execution by, or to control the operation of, data processing apparatus.

If implemented in software, the functions may be stored on or transmitted over as one or more instructions or code on a computer-readable medium. The processes of a method or algorithm disclosed herein may be implemented in a processor-executable software module which may reside on a computer-readable medium. Computer-readable media includes both computer storage media and communication media including any medium that may be enabled to transfer a computer program from one place to another. A storage media may be any available media that may be accessed by a computer. By way of example, and not limitation, such computer-readable media may include random-access memory (RAM), read-only memory (ROM), electrically erasable programmable read-only memory (EEPROM), CD-ROM or other optical disk storage, magnetic disk storage or other magnetic storage devices, or any other medium that may be used to store desired program code in the form of instructions or data structures and that may be accessed by a computer. Also, any connection may be properly termed a computer-readable medium. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those skilled in the art, and the generic principles defined herein may be applied to some other implementations without departing from the spirit or scope of this disclosure. Thus, the claims are not intended to be limited to the implementations shown herein but are to be accorded the widest scope consistent with this disclosure, the principles and the novel features disclosed herein.

Additionally, a person having ordinary skill in the art will readily appreciate, opposing terms such as "upper" and "lower" or "front" and back" or "top" and "bottom" or "forward" and "backward" are sometimes used for ease of describing the figures, and indicate relative positions corresponding to the orientation of the figure on a properly oriented page, and may not reflect the proper orientation of any device as implemented.

Certain features that are described in this specification in the context of separate implementations also may be implemented in combination in a single implementation. Conversely, various features that are described in the context of a single implementation also may be implemented in multiple implementations separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one or more example processes in the form of a flow diagram. However, other operations that are not depicted may be incorporated in the example processes that are schematically illustrated. For example, one or more additional operations may be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems may generally be integrated together in a single software product or packaged into multiple software products. Additionally, some other implementations are within the scope of the following claims. In some cases, the actions recited in the claims may be performed in a different order and still achieve desirable results.

As used herein, including in the claims, the term "or," when used in a list of two or more items, means that any one of the listed items may be employed by itself, or any combination of two or more of the listed items may be employed. For example, if a composition is described as containing components A, B, or C, the composition may contain A alone; B alone; C alone; A and B in combination; A and C in combination; B and C in combination; or A, B, and C in combination. Also, as used herein, including in the claims, "or" as used in a list of items prefaced by "at least one of" indicates a disjunctive list such that, for example, a list of "at least one of A, B, or C" means A or B or C or AB or AC or BC or ABC (that is A and B and C) or any of these in any combination thereof. The term "substantially" is defined as largely but not necessarily wholly what is specified (and includes what is specified; for example, substantially 90 degrees includes 90 degrees and substantially parallel includes parallel), as understood by a person of ordinary skill in the art. In any disclosed implementations, the term "substantially" may be substituted with "within [a percentage] of" what is specified, where the percentage includes 0.1, 1, 5, or 10 percent.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. An apparatus, comprising:
a radio frequency (RF) module comprising a first input node, a second input node, a first output node, a second output node, and a third output node, the RF module comprising:
a first processing path configured to couple the first input node to the first output node; and
a second processing path configured to couple the second input node to the second output node in a first mode and to couple the second input node to the third output node in a second mode;
a combiner module configured to combine a first output signal at the first output node with a second output signal at the second output node for output at a first antenna output node;
a matching module configured to output a third output signal from the third output node for output at a second antenna output node;
a controller coupled to the RF module and configured to configure the RF module in the first mode for single antenna operation and to configure the RF module in the second mode for multiple antenna operation; and
a modem configured to output a first radio frequency input signal to the first input node and to output a second radio frequency input signal to the second input node, wherein the modem operates the controller to select between the first mode and the second mode based on at least one of a signal to noise ratio (SNR) or one or more network-level parameters.

2. The apparatus of claim 1, further comprising a first antenna coupled to the first output node and a second antenna coupled to the third output node, wherein the first antenna and the second antenna are configured in a 2×2 MIMO antenna array.

3. The apparatus of claim 1, wherein the RF module comprises:
a first amplifier coupled to the first input node and the first output node and configured to amplify a first radio frequency input signal at the first input node for output to the first output node; and
a second amplifier coupled to the second input node, the second output node, and the third output node and configured to amplify a second radio frequency input signal at the second input node for output to the second output node or the third output node.

4. The apparatus of claim 3, further comprising:
a first switch coupled between the second amplifier and the second output node; and
a second switch coupled between the second amplifier and the third output node, wherein:
the first switch is closed and the second switch is open in the first mode, and
the first switch is open and the second switch is closed in the second mode.

5. The apparatus of claim 1, wherein the RF module comprises:

a first amplifier coupled to the first input node and the first output node and configured to amplify a first radio frequency input signal at the first input node for output to the first output node;

a second amplifier coupled to the second input node and the second output node and configured to amplify a second radio frequency input signal at the second input node for output to the second output node; and a third amplifier coupled to the second input node and the third output node and configured to amplify the second radio frequency input signal at the second input node for output to the third output node.

6. The apparatus of claim 5, further comprising:

a first switch coupled between the second input node and the second amplifier; and a second switch coupled between the second input node and the third amplifier, wherein:

the first switch is closed and the second switch is open in the first mode, and the first switch is open and the second switch is closed in the second mode.

7. The apparatus of claim 6, further comprising:

a pre-amplifier module comprising a first pre-amplifier and a second pre-amplifier, wherein the first switch and the second switch are included in the pre-amplifier module.

8. The apparatus of claim 7, wherein the first pre-amplifier and the second pre-amplifier are included in a pre-amplifier module comprising a first semiconductor die, and wherein the first amplifier and the second amplifier and the third amplifier together comprise an amplifier module comprising a second semiconductor die.

9. The apparatus of claim 8, wherein the first semiconductor die comprises a Gallium Arsenide (GaAs) substrate and the second semiconductor die comprises a Silicon (Si) substrate.

10. The apparatus of claim 1, wherein the first processing path comprises a splitter coupled to the second processing path, and wherein in the first mode the second processing path couples the splitter to the second output node and in the second mode the second processing path couples the second input node to the third output node.

11. The apparatus of claim 10, wherein:

the first processing path comprises a first amplifier, and the second processing path comprises: a second amplifier coupled between the splitter and the second output node; and a third amplifier coupled between the second input node and the third output node.

12. The apparatus of claim 10, wherein the second processing path comprises at least one switch coupled between the splitter and the second output node, wherein the at least one switch is configured to couple the splitter to the second output node when the RF module is configured for single antenna operation and to couple the second input node to the third output node when the RF module is configured for multiple antenna operation.

13. The apparatus of claim 10, wherein:

the first processing path comprises a first amplifier, and the second processing path comprises:

a second amplifier coupled to the splitter and to the second input node;

a first switch coupled between the second amplifier and the second output node; and a second switch coupled between the second amplifier and the third output node, wherein in the first mode the first switch is closed and the second switch is open, and in the second mode the first switch is open and the second switch is closed.

14. The apparatus of claim 1, wherein the modem comprises a digital splitter coupled to both a first transmit chain configured to output a first RF signal to the first input node and a second transmit chain configured to output a second RF signal to the second input node.

15. The apparatus of claim 1, wherein the RF module comprises a GaAs semiconductor substrate.

16. The apparatus of claim 15, further comprising a pre-amplifier module coupled to the first input node and the second input node, wherein the pre-amplifier module comprises a Si semiconductor substrate.

17. The apparatus of claim 1, wherein the first processing path comprises a first amplifier having a first power capability and the second processing path comprises a second amplifier having a second power capability equal to or lower than the first power capability.

18. An apparatus, comprising:

a memory storing processor-readable code; and at least one processor coupled to the memory, the at least one processor configured to execute the processor-readable code to cause the at least one processor to switch an amplifier module between a first mode and a second mode for amplifying transmit signals for output to an array of antennas such that the amplifier module is configured for:

receiving a first radio frequency input signal;

processing the first radio frequency input signal in a first processing path to output a first transmit signal at a first output port;

receiving a second radio frequency input signal;

receiving an amplifier mode control signal;

when the amplifier mode control signal indicates the first mode, processing the second radio frequency input signal in a second processing path to output a second transmit signal at a second output port; and when the amplifier mode control signal indicates the second mode, processing the second radio frequency input signal in the second processing path to output the second transmit signal at a third output port, wherein the first mode corresponds to single antenna operation and the second mode corresponds to multiple antenna operation, wherein the at least one processor switches the amplifier module such that, when the amplifier mode control signal indicates the first mode, the amplifier module combines the first transmit signal and the second transmit signal for transmission on a first antenna, and wherein the at least one processor switches the amplifier module such that, when the amplifier mode control signal indicates the second mode, the amplifier module outputs the second transmit signal for transmission on a second antenna simultaneously with outputting a third transmit signal on the first antenna.

19. An apparatus, comprising:

a radio frequency (RF) module comprising a first input node, a second input node, a first output node, a second output node, and a third output node, the RF module comprising:

a first processing path configured to couple the first input node to the first output node; and a second processing path configured to couple the second input node to the second output node in a first mode and to couple the second input node to the third output node in a second mode;

a combiner module configured to combine a first output signal at the first output node with a second output signal at the second output node for output at a first antenna output node; and a matching module configured to output a third output signal from the third output node for output at a second antenna output node, wherein the first processing path comprises a splitter coupled to the second processing path, and wherein in the first mode the second processing path couples the splitter to the second output node and in the second mode the second processing path couples the second input node to the third output node, wherein:

the first processing path comprises a first amplifier, and the second processing path comprises:

a second amplifier coupled to the splitter and to the second input node;

a first switch coupled between the second amplifier and the second output node; and a second switch coupled between the second amplifier and the third output node, wherein in the first mode the first switch is closed and the second switch is open, and in the second mode the first switch is open and the second switch is closed.

20. The apparatus of claim 19, further comprising: a controller coupled to the RF module and configured to configure the RF module in the first mode for single antenna operation and to configure the RF module in the second mode for multiple antenna operation.

21. The apparatus of claim 19, wherein the first amplifier has a first power capability and the second amplifier has a second power capability equal to or lower than the first power capability.

22. The apparatus of claim 19, further comprising a first antenna coupled to the first output node and a second antenna coupled to the third output node, wherein the first antenna and the second antenna are configured in a 2×2 MIMO antenna array.

23. An apparatus, comprising:

a radio frequency (RF) module comprising a first input node, a second input node, a first output node, a second output node, and a third output node, the RF module comprising:

a first processing path configured to couple the first input node to the first output node; and a second processing path configured to couple the second input node to the second output node in a first mode and to couple the second input node to the third output node in a second mode;

a combiner module configured to combine a first output signal at the first output node with a second output signal at the second output node for output at a first antenna output node;

a matching module configured to output a third output signal from the third output node for output at a second antenna output node; and a modem coupled to the first input node and the second input node, wherein the modem comprises a digital splitter coupled to both a first transmit chain configured to output a first RF signal to the first input node and a second transmit chain configured to output a second RF signal to the second input node.

24. The apparatus of claim 23, further comprising: a controller coupled to the RF module and configured to configure the RF module in the first mode for single antenna operation and to configure the RF module in the second mode for multiple antenna operation.

25. The apparatus of claim 23, wherein the RF module comprises:

a first amplifier coupled to the first input node and the first output node and configured to amplify a first radio frequency input signal at the first input node for output to the first output node; and a second amplifier coupled to the second input node, the second output node, and the third output node and configured to amplify a second radio frequency input signal at the second input node for output to the second output node or the third output node.

26. The apparatus of claim 25, further comprising:

a first switch coupled between the second amplifier and the second output node; and a second switch coupled between the second amplifier and the third output node.

27. The apparatus of claim 25, wherein the first amplifier has a first power capability and the second amplifier has a second power capability equal to or lower than the first power capability.

* * * * *